(12) United States Patent
Raghupathy et al.

(10) Patent No.: US 7,915,954 B2
(45) Date of Patent: Mar. 29, 2011

(54) AMPLIFIER PREDISTORTION AND AUTOCALIBRATION METHOD AND APPARATUS

(75) Inventors: Arun Raghupathy, San Diego, CA (US); Puay Hoe See, San Diego, CA (US); Gurkanwal Kamal Sahota, San Diego, CA (US); Robert Reeves, Escondido, CA (US); Paul E. Peterzell, Plantation, FL (US)

(73) Assignee: QUALCOMM, Incorporated, San Diego, CA (US)

( * ) Notice: Subject to any disclaimer, the term of this patent is extended or adjusted under 35 U.S.C. 154(b) by 872 days.

(21) Appl. No.: 10/987,360

(22) Filed: Nov. 12, 2004

(65) Prior Publication Data

US 2005/0156662 A1 Jul. 21, 2005

Related U.S. Application Data

(60) Provisional application No. 60/537,145, filed on Jan. 16, 2004.

(51) Int. Cl.
*H03F 3/68* (2006.01)
(52) U.S. Cl. .......................... 330/149; 330/151; 375/316
(58) Field of Classification Search .................. 375/316; 330/151, 149
See application file for complete search history.

(56) References Cited

U.S. PATENT DOCUMENTS

| 6,072,364 A | 6/2000 | Jeckeln et al. |
| 6,496,062 B1 | 12/2002 | Nitz et al. |
| 6,600,792 B2 | 7/2003 | Antonio et al. |
| 6,642,786 B1 | 11/2003 | Jin et al. |
| 2002/0196864 A1 | 12/2002 | Booth et al. |
| 2003/0184374 A1 | 10/2003 | Huang et al. |
| 2005/0018790 A1* | 1/2005 | Liu .............................. 375/316 |

FOREIGN PATENT DOCUMENTS

GB 2265270 A 9/1993
(Continued)

OTHER PUBLICATIONS

International Search Report - PCT/US05/001444, International Searching Authority - European Patent Office, Jun. 22, 2005.
(Continued)

*Primary Examiner* — Michael B Shingleton
(74) *Attorney, Agent, or Firm* — Kevin Cheatham; William M. Hooks

(57) ABSTRACT

Methods and apparatus for amplifier AM and PM predistortion and autocalibration. AM and PM amplifier distortion can be corrected using predistortion. The AM and PM distortion characteristics of the amplifier are determined using an autocalibration technique. The amplifier characteristics can be stored in distinct look up tables. Alternatively, the inverse of the amplifier characteristics can be stored in distinct look up tables. Signals that are to be amplified are characterized in polar format having a phase component with a normalized magnitude and a magnitude component. The phase component can be predistorted by applying the inverse of the PM distortion characteristics to the signal. Similarly, the magnitude component can be predistorted by applying the inverse of the AM distortion characteristics to the signal. The predistorted phase component can be amplified using the previously characterized amplifier. The predistorted magnitude component can be used to set the gain of the previously characterized amplifier.

15 Claims, 14 Drawing Sheets

FOREIGN PATENT DOCUMENTS

| | | |
|---|---|---|
| JP | 2000-244597 | 9/2000 |
| JP | 2001-268150 | 9/2001 |
| JP | 2002-536902 | 10/2002 |
| JP | 2003-298429 | 10/2003 |
| RU | 2115222 | 7/1998 |
| WO | 9318581 | 9/1993 |
| WO | 0108320 | 2/2001 |
| WO | 0233774 | 4/2002 |
| WO | 03/036896 A | 5/2003 |

OTHER PUBLICATIONS

Written Opinion - PCT/US05/001444, International Searching Authority - European Patent Office, Jun. 22, 2005.

International Preliminary Report on Patentability - PCT/US05/001444, IPEA/US, Apr. 6, 2006.

* cited by examiner

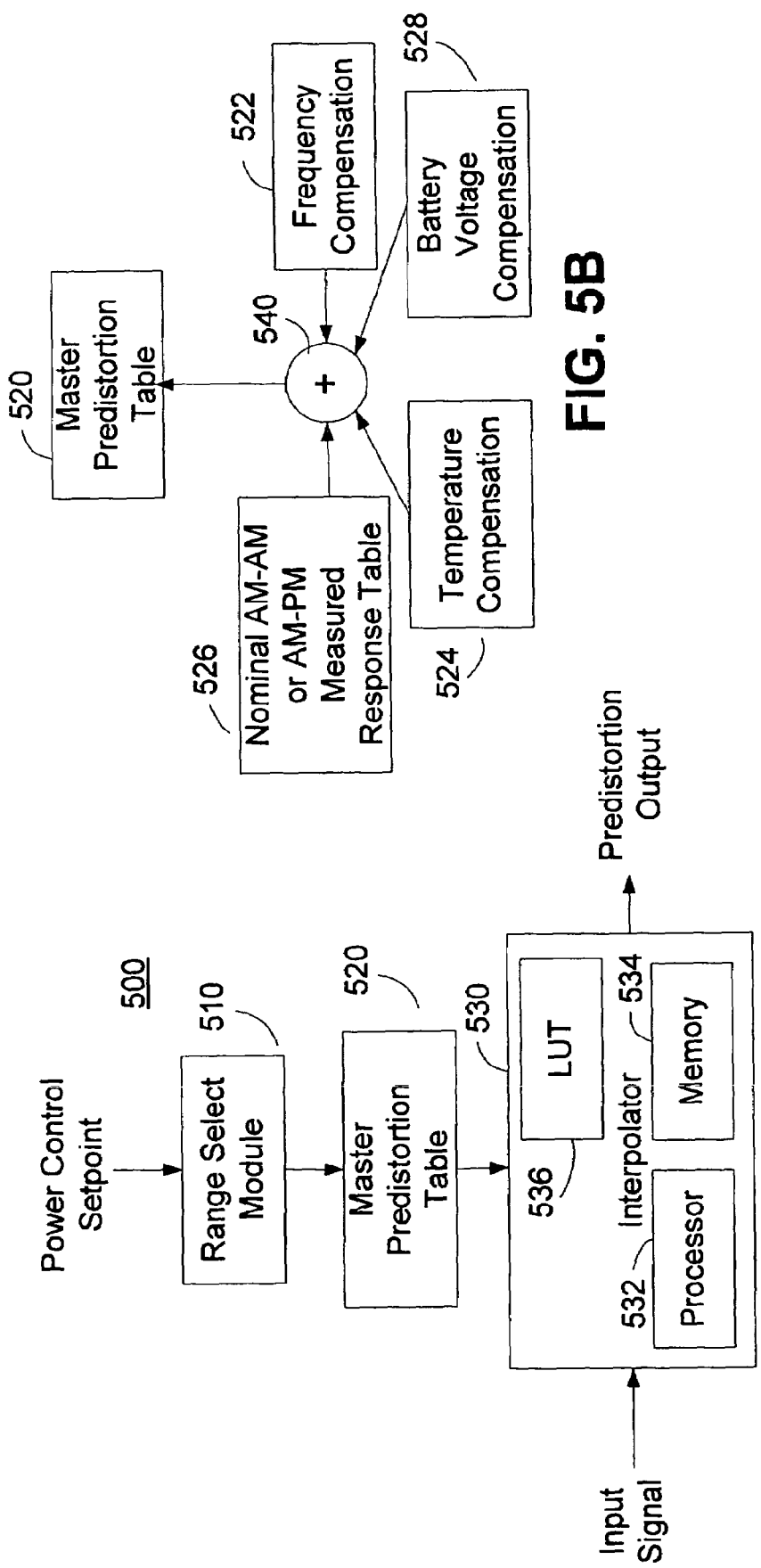

AMPLIFIER PREDISTORTION AND AUTOCALIBRATION METHOD AND APPARATUS

CROSS-REFERENCES TO RELATED APPLICATIONS

This application claims the benefit of U.S. Provisional Application No. 60/537,145, filed Jan. 16, 2004, entitled ENVELOPE ELIMINATION AND RESTORATION (EER) WITH PRE-DISTORTION & AUTO-CALIBRATION FOR EDGE TRANSMITTER; which is hereby incorporated herein by reference in its entirety.

BACKGROUND OF THE DISCLOSURE

Variable gain amplifiers are commonly used in communication devices. Such amplifiers can be used, for example, in the receive path of a wireless communication device as part of an Automatic Gain Control (AGC) circuit. The variable gain amplifier can be used to maintain a range of intermediate frequency amplitudes for subsequent processing. Variable gain amplifiers may also be used in the transmit path of a wireless communication device. A variable gain amplifier may be used, for example, to set the output power of a transmitted signal.

Of course, a real amplifier does not have the characteristics of an ideal amplifier. An ideal amplifier can provide unlimited amounts of output power and can be perfectly linear. However, an amplifier typically contributes some nonlinear distortion. The amplifier may, for example, produce harmonics and higher order distortion products. Additionally, a variable gain amplifier may produce varying phase delays based on the gain value. Manufacturing differences between amplifiers and amplifiers lots may produce variations in a gain transfer function. Additionally, the amplifier gain, in dB, may not be a linear function of a control input.

For many applications, the distortion contributed by an amplifier may be negligible and may be ignored. However, for other applications, the amount of signal distortion contributed by the amplifier may adversely affect the signal quality to an extent that a communication link is substantially degraded.

For example, a transmitter in a wireless telephone system operating in accordance with the Global System for Mobile communications (GSM) standards, such as those defined in ETSI 3GPP specifications, typically operates with Gaussian Minimum Shift Keying (GMSK). GMSK is characterized as having a constant envelope. The GSM specifications have evolved to include a data mode referred to as Enhanced Datarate for GSM Evolution (EDGE). A transmitter operating in a GSM EDGE Radio Access Network (GERAN) can operate with GMSK modulation or can operate with $3\pi/8$ Phase Shift Keying (PSK) modulation. The $3\pi/8$ PSK modulation does not have a constant envelope, but instead, has an envelope that varies by approximately 17 dB. The variation in the amplitude envelope poses additional constraints on amplifier performance. Wireless transmitters having amplifiers that were originally configured to operate using constant envelope GMSK modulation may not perform satisfactorily with $3\pi/8$ PSK modulation.

BRIEF SUMMARY OF THE DISCLOSURE

It is desirable to increase the performance of an amplifier by decreasing the amount of distortion that the amplifier contributes to the signal being amplified. Minimizing the effects of amplifier distortion allows for more efficient and better performing communication device implementations.

Methods and apparatus for amplifier AM and PM predistortion and autocalibration are disclosed. AM and PM amplifier distortion can be corrected using predistortion. The AM and PM distortion characteristics of the amplifier are determined using an autocalibration technique. The amplifier characteristics can be stored in distinct look up tables. Alternatively, the inverse of the amplifier characteristics can be stored in distinct look up tables. Signals that are to be amplified are characterized in polar format having a phase component with a normalized magnitude and a magnitude component. The phase component can be predistorted by applying the inverse of the PM distortion characteristics to the signal. Similarly, the magnitude component can be predistorted by applying the inverse of the AM distortion characteristics to the signal. The predistorted phase component can be amplified using the previously characterized amplifier. The predistorted magnitude component can be used to set the gain of the previously characterized amplifier.

The disclosure includes a method of generating a distortion compensated signal, including generating a polar representation of a signal having an envelope signal component and a phase signal component, predistorting the envelope signal component to generate a predistorted envelope signal component, predistorting the phase signal component to generate a predistorted phase signal component, and amplitude modulating the predistorted phase signal component with the predistorted envelope signal component to generate the distortion compensated signal.

The disclosure also includes a method of generating a distortion compensated signal, including receiving a power control setpoint value, determining an operating range from a plurality of ranges based on the power control setpoint value, determining a signal envelope value, determining a distortion compensation value based on the operating range and the signal envelope value, and applying the distortion compensation value to a signal to generate the distortion compensated signal.

The disclosure includes a method of calibrating a predistortion module, including generating a calibration signal, amplifying the calibration signal based in part on a value of a power control setpoint to generate an amplified calibration signal, receiving a signal sample based on the amplified calibration signal, comparing a characteristic of the signal sample to a similar characteristic of the calibration signal, determining a distortion characteristic based on the comparison, and storing the distortion characteristic in a look up table of the predistortion module to calibrate the predistortion module.

The disclosure also includes an apparatus for generating a distortion compensated signal, including a range select module configured to receive a power control setpoint value and determine an operating range based in part on the power control setpoint value, a look up table configured to store a plurality of distortion compensation values in each of a plurality of operating ranges, and a interpolator configured to access a portion of the look up table based in part on the operating range, determine a distortion compensation, and apply the distortion compensation to a signal to generate the distortion compensated signal.

The disclosure also includes an apparatus for generating a distortion compensated signal, including a rectangular to polar converter configured to convert a rectangular representation of a signal to a polar representation having an envelope signal component and a phase signal component, a first predistortion module coupled to the rectangular to polar converter and configured to predistort the envelope signal component to generate a predistorted envelope signal, a second predistortion module coupled to the rectangular to polar converter and configured to predistort the phase signal component to generate a predistorted phase signal, and a power amplifier coupled to the first and second predistortion modules and configured to amplitude modulate the predistorted phase signal based in part on the predistorted envelope signal.

BRIEF DESCRIPTION OF THE DRAWINGS

The features, objects, and advantages of embodiments of the disclosure will become more apparent from the detailed description set forth below when taken in conjunction with the drawings, in which like elements bear like reference numerals.

FIGS. 5A-5B are functional block diagrams of embodiments of predistortion modules and portions of predistortion modules.

DETAILED DESCRIPTION OF THE DISCLOSURE

Figure 1:
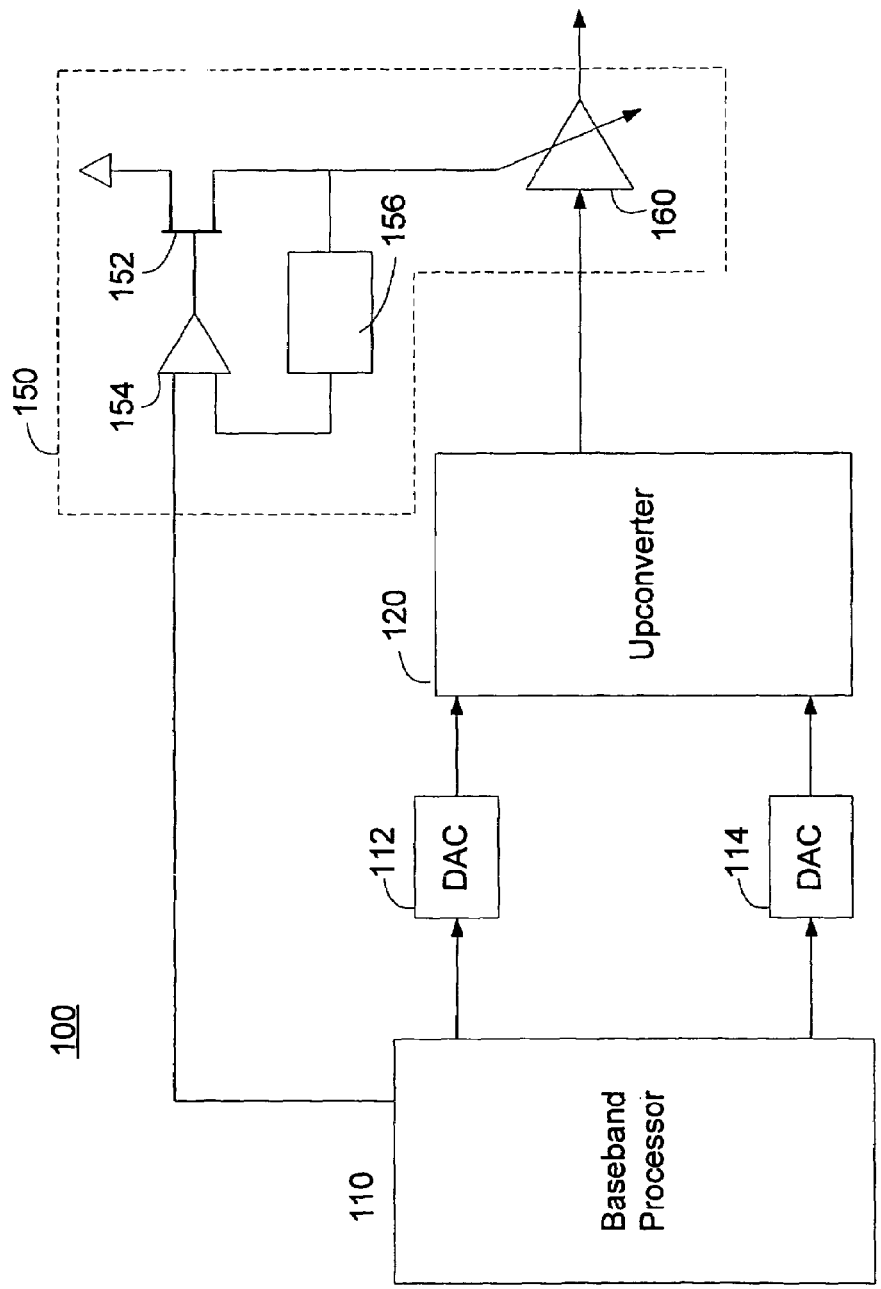
FIG. 1 is a functional block diagram of an uncompensated transmitter signal path.

The effects of amplifier distortion can be reduced to acceptable levels by predistorting the signals to the amplifier. Signal distortion contributed by a variable gain power amplifier in a wireless communication device can be minimized by predistorting a gain control signal, a phase of the input signal, or a combination of the two.

In order to compensate for amplifier distortion effects, the amplifier can be characterized by measuring the performance of the amplifier. Alternatively, amplifier characteristics may be supplied by a manufacturer or can be generalized across multiple amplifiers using statistical sampling, statistical characterization, or simulations. The amplifier gain characteristics or gain transfer function can be determined. Additionally, the amplifier phase characteristics can be determined over a gain range of the amplifier.

The amplifier characteristics may be determined at a single frequency or at multiple frequencies. Additionally, the amplifier characteristics may be determined at a single temperature or may be characterized at multiple temperatures. The number of frequency or temperature characteristics that are determined can depend on the variations exhibited by the amplifier or amplifier module being characterized.

The amplifier characteristics can be stored in a look up table. A predistortion module can determine an inverse of the amplifier characteristics. The inverse characteristics are the predistortion characteristics that can be used to invert, or negate, the effects of the amplifier characteristics. The predistortion module can also include an interpolator module that is configured to interpolate between two or more points on the amplifier characteristic. The interpolator can interpolate between the points using, for example, a linear interpolation or a higher order interpolation.

A signal having a varying envelope can be characterized in polar coordinates as a unity magnitude phasor and an magnitude component. One or both of the phasor and magnitude component can be predistorted to compensate for the distortion effects of subsequent amplifier stages.

Thus, the magnitude or envelope amplifier nonlinearities can be corrected independently of the phase nonlinearities. To correct for the magnitude distortions of the amplifier, the magnitude component of the signal is predistorted with the inverse of the amplifier magnitude distortion characteristics previously stored in a look up table. Similarly, to correct for phase distortions of the amplifier, the phase component of the signal is predistorted with the inverse of the amplifier phase distortion characteristics previously stored in a look up table.

In the above discussion and generally throughout the disclosure, the term amplifier or amplifier module can be used to refer to a single amplifier, an amplifier module having one or more amplifiers, or multiple amplifiers, which may be directly coupled to one another or which may have intervening elements placed between amplifier stages. Additionally, while the above discussion and the disclosure in general refers to predistortion, the signals can be distorted to compensate for the distortion effects of prior amplifiers.

FIG. 1 is a functional block diagram of a portion of an uncompensated transmitter 100, which may be typical of a portion of a GSM transmitter. The transmitter 100 includes a baseband processor 110 having in-phase (I) and quadrature (Q) outputs. The I and Q outputs of the baseband processor 110 are coupled to respective Digital to Analog Converters (DAC) 112 and 114.

The I and Q outputs from the DACs 112 and 114 are then upconverted to a desired RF using an upconverter 120 The upconverter 120 can be configured to implement any suitable upconversion including, but not limited to, direct upconversion, dual conversion, Offset Phase Lock Loop (OPLL) upconversion, and the like, or some other upconversion.

In one embodiment, the converted in-phase signal is upconverted to, for example, an RF signal using a first mixer driven by a Local Oscillator (LO). Similarly, the converted quadrature signal is upconverted using a second mixer. The second mixer is driven by an output of the LO that has been shifted by 90 degrees using a phase shifter.

The outputs of the first and second mixers can be coupled to inputs of a signal combiner that sums the two signals together. The output of the signal combiner can be coupled to an amplifier module 150.

The amplifier module 150 can include a variable gain amplifier 160. The gain of the variable gain amplifier 160 can be controlled by setting a control voltage value. The control voltage can be coupled to an input, such as a non-inverting input of a differential amplifier 154. The output of the differential amplifier 154 is coupled to a gate of a FET 152 that can be configured, for example, to vary the supply voltage to the variable gain amplifier 160 in order to vary its gain. A feedback module 156 feeds back the supply voltage of the variable gain amplifier 160 to another input, for example the inverting input, of the differential amplifier 154. The transfer function of the feedback module 156 can be configured to provide a relationship between the control voltage value and the supply voltage of the variable gain amplifier 160.

Thus, the output power from the transmitter 100 can be controlled by determining an output power at the output of the baseband processor 110, adding or subtracting the gains of the various fixed gain modules, and setting the control voltage at the amplifier module 150 to set the gain of the variable gain amplifier 160 to the desired gain needed to achieve the desired output power.

The uncompensated transmitter 100 configuration provides essentially no compensation for amplitude or phase distortions. The output signal from the baseband processor 110 is subjected to the cumulative distortions from each of the subsequent stages.

The majority of the signal processing modules have fixed gain. Each of the fixed gain modules may not vary significantly over the range of an amplitude varying signal, such as a GSM EDGE signal that has approximately 17 dB of variation. However, the cumulative amplitude distortion may significantly degrade the signal. Additionally, the amplifier module 150, and particularly the variable gain amplifier 160, may contribute significant amplitude distortions at a portion of the gain range. Similarly, each of the signal processing stages may contribute phase distortion to the signal.

The amplitude distortion, which may be characterized as an Amplitude Modulation (AM) distortion, and the phase distortion, which may be characterized as a Phase Modulation (PM) distortion, have an impact on the ability of a transmitter, such as the transmitter 100 of FIG. 1, to meet system specifications.

Figure 2A:
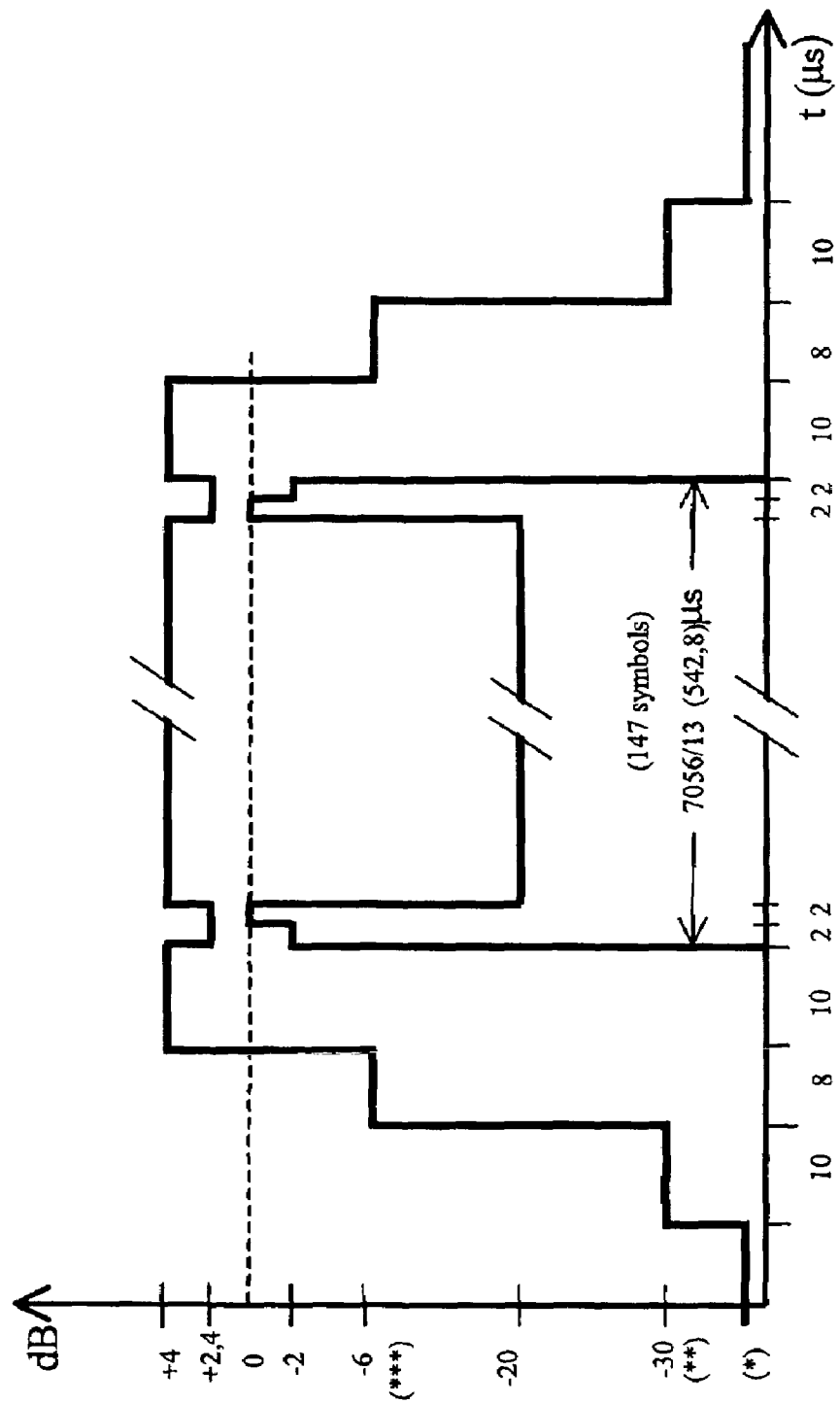
FIG. 2A is a plot of a prior art amplitude envelope mask for a GSM EDGE transmitter.

FIG. 2A is a plot of a time envelope mask 200 for a transmitter operating in accordance with a GSM EDGE wireless telephone specification. The GSM system is a Time Domain Multiple Access (TDMA) system having defined time slots for transmission and reception of communication signals. Thus, the specification constrains the time frame and associated power during which a transmitter may ramp up the transmit power when transmitting in an assigned time slot. Additionally, the specification constrains the time frame and associated power during which the transmitter ramps down the power after the assigned time slot. The time envelope mask 200 also specifies the limits of amplitude variation during the assigned time slot. Amplitude distortions in the transmit chain affect the ability of the transmitter to conform to the specified time envelope mask 200.

Figure 2B:
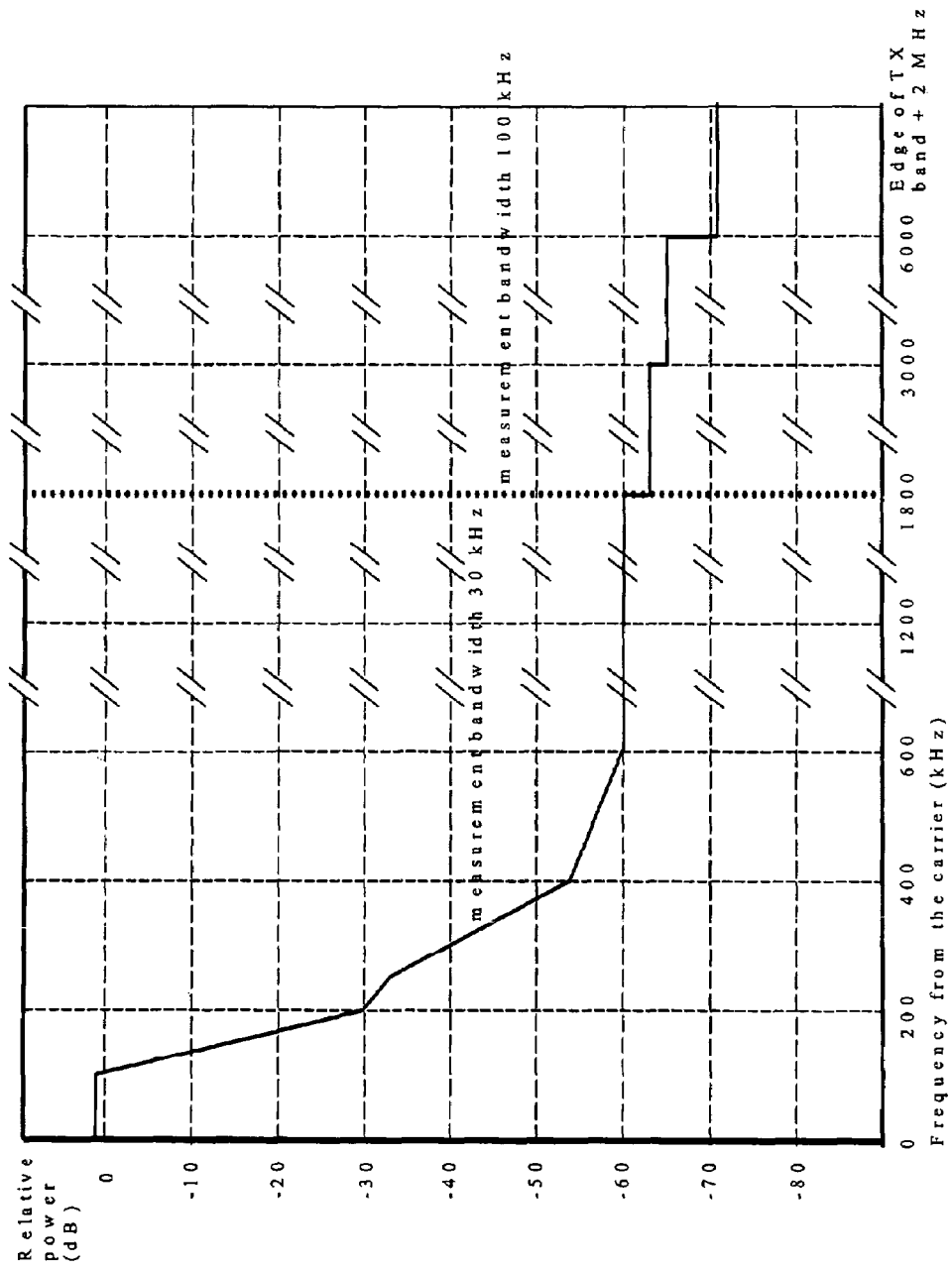
FIG. 2B is a plot of a prior art spectrum mask for a GSM EDGE transmitter.

In addition to conforming to a time envelope mask 200, a transmitter needs to satisfy a spectral mask 210. FIG. 2B is a plot of a transmitter spectral mask 210 for a GSM EDGE transmitter. The transmitter spectral mask 210 specifies the spectral distribution of a signal. A transmitter is constrained to the specified spectral mask 210 in order to minimize the interference the transmitter generates in adjacent channels. Higher order AM distortions can contribute to out of band spectral products. In addition, PM distortions and phase errors can contribute to the level of sidebands of the signal. PM distortion results in increased sideband levels and decreases the ability of the transmitter to conform to the spectral mask 210.

Figure 3:
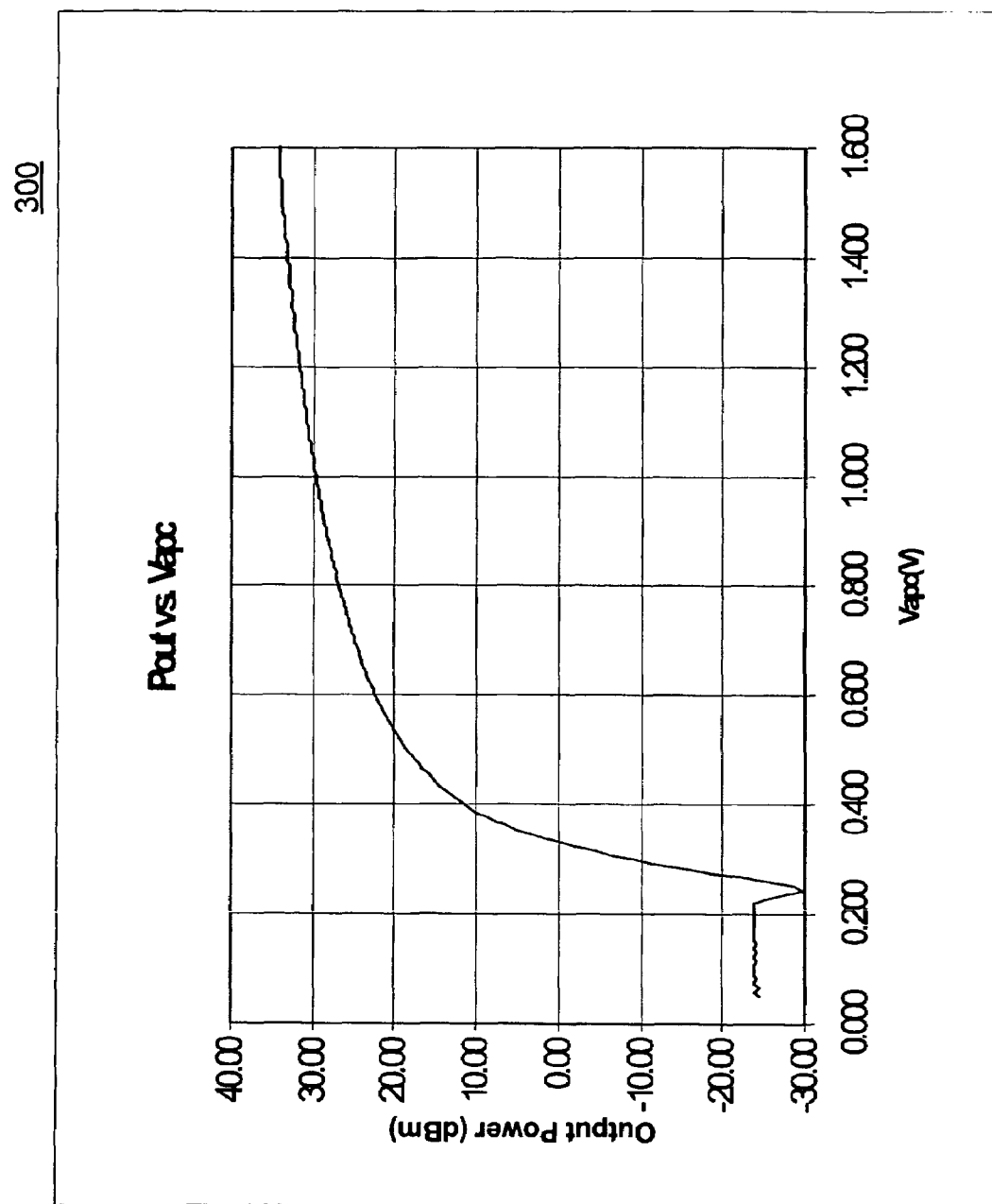
FIG. 3 is a plot of an example of amplifier gain characteristic.

The AM and PM distortion contributed by elements in the transmit chain, particularly the amplifier module, can be corrected by characterizing the distortion and predistorting the signals. FIG. 3 is a plot of an embodiment of a gain characterization curve 300 that can be incorporated in a portion of a predistortion module.

In one embodiment, the characterization curve 300 can be stored in a look up table as will be discussed below. The characterization curve 300 can provide an indication of the level of AM distortion that the amplifier module will contribute if an AM signal is provided to the control voltage input. Because the characterization curve 300 provides an indication of AM distortion for an AM signal input, the characterization curve 300 reflects AM-AM distortion contributed by the amplifier module. In another embodiment, a subset of the points used to generate the characterization curve 300 can be stored in a look up table. In still another embodiment, a polynomial can be fit to the points on the characterization curve 300, for example, by determining a polynomial of a predetermined order that provides a least mean square error. In another embodiment, the characterization curve 300 can be stored as a plurality of piecewise continuous polynomials, each polynomial fit to a portion of the characterization curve 300. For example, the characterization curve 300 may be divided into a plurality of sections, and a polynomial, such as a cubic spline, can be fit to the points of each section. Other embodiments may use a combination of techniques or some other techniques.

In the characterization curve 300 of FIG. 3, the output power of an amplifier module, such as the amplifier module 150 of FIG. 1, can be measured for uniformly spaced control voltage values and a predetermined input power. Alternatively, the gain of the amplifier module may be measured with varying control voltage values. In other embodiments, the control voltage values need not be spaced uniformly, and may be spaced relative to a change in output power, relative to a deviation from a linear response, or relative to some other factor.

Figure 4:
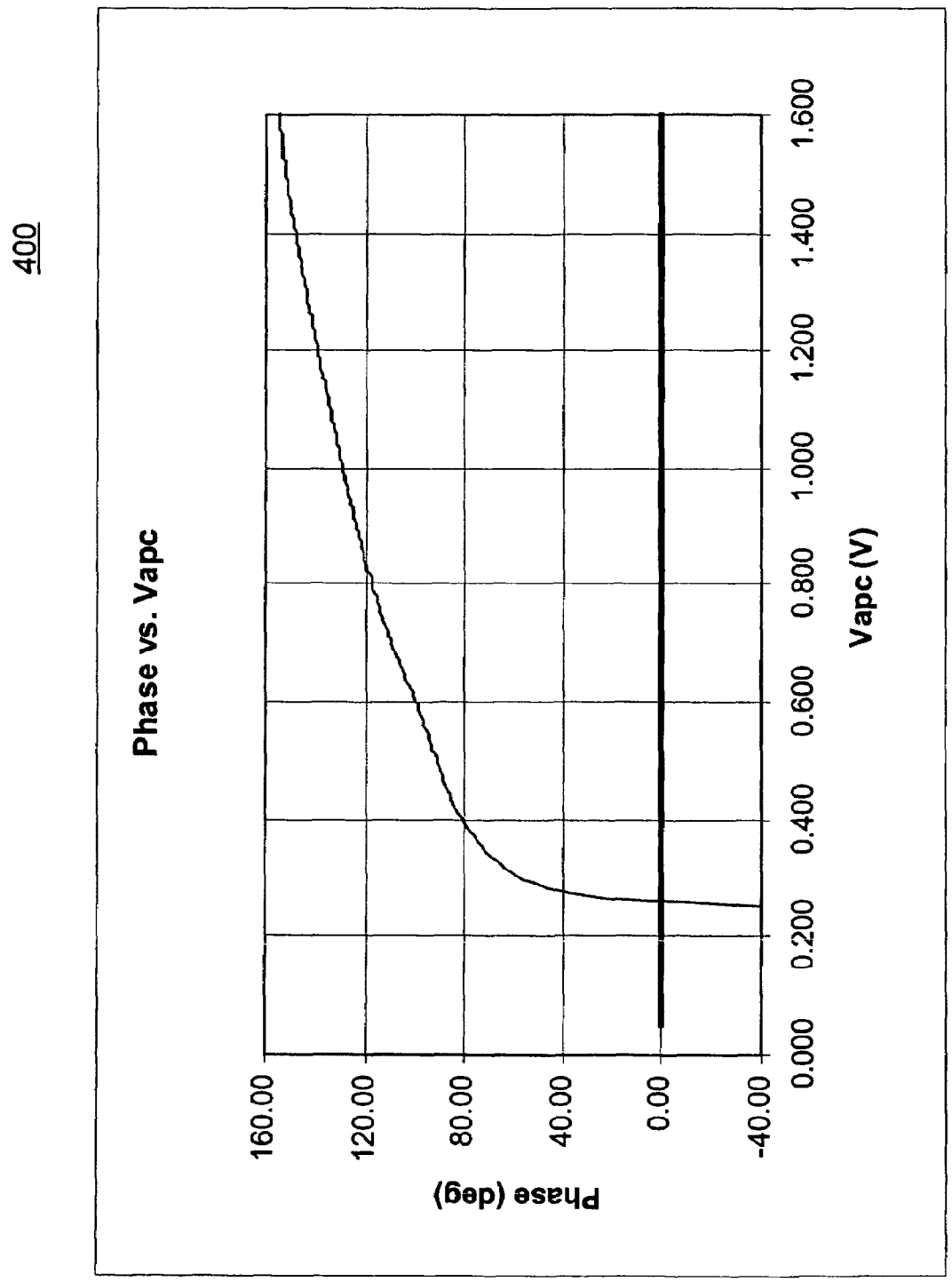
FIG. 4 is a plot of an example of amplifier phase characteristic.

FIG. 4 is a is a plot of an embodiment of a phase shift characterization curve 400 that can be incorporated in a portion of a predistortion module. The characterization curve 400 shows the phase shift of the amplifier module in relation to uniform increments of the control voltage value. Because the characterization curve 400 provides an indication of PM distortion for an AM signal input, the characterization curve 400 reflects AM-PM distortion contributed by the amplifier module. As was the case of the power or gain characterization curve, the characterization curve 400 or some derivative of the characterization curve 400 can be stored in a look up table as distinct points or a generator polynomial. Additionally, although the characterization curve is shown with uniformly spaced control voltage values, the characterization curve 400 need not be determined using uniform control voltage spacing.

FIG. 5A is a functional block diagram of an embodiment of a predistortion module 500. The predistortion module 500 can be configured to provide a predistortion output for either AM-AM distortion or AM-PM distortion. The predistortion module 500 can include one or more signal inputs and one or more signal outputs. The input signals and resultant output signals can depend on whether the predistortion module 500 is configured for AM-AM or AM-PM predistortion.

Figure 6A:
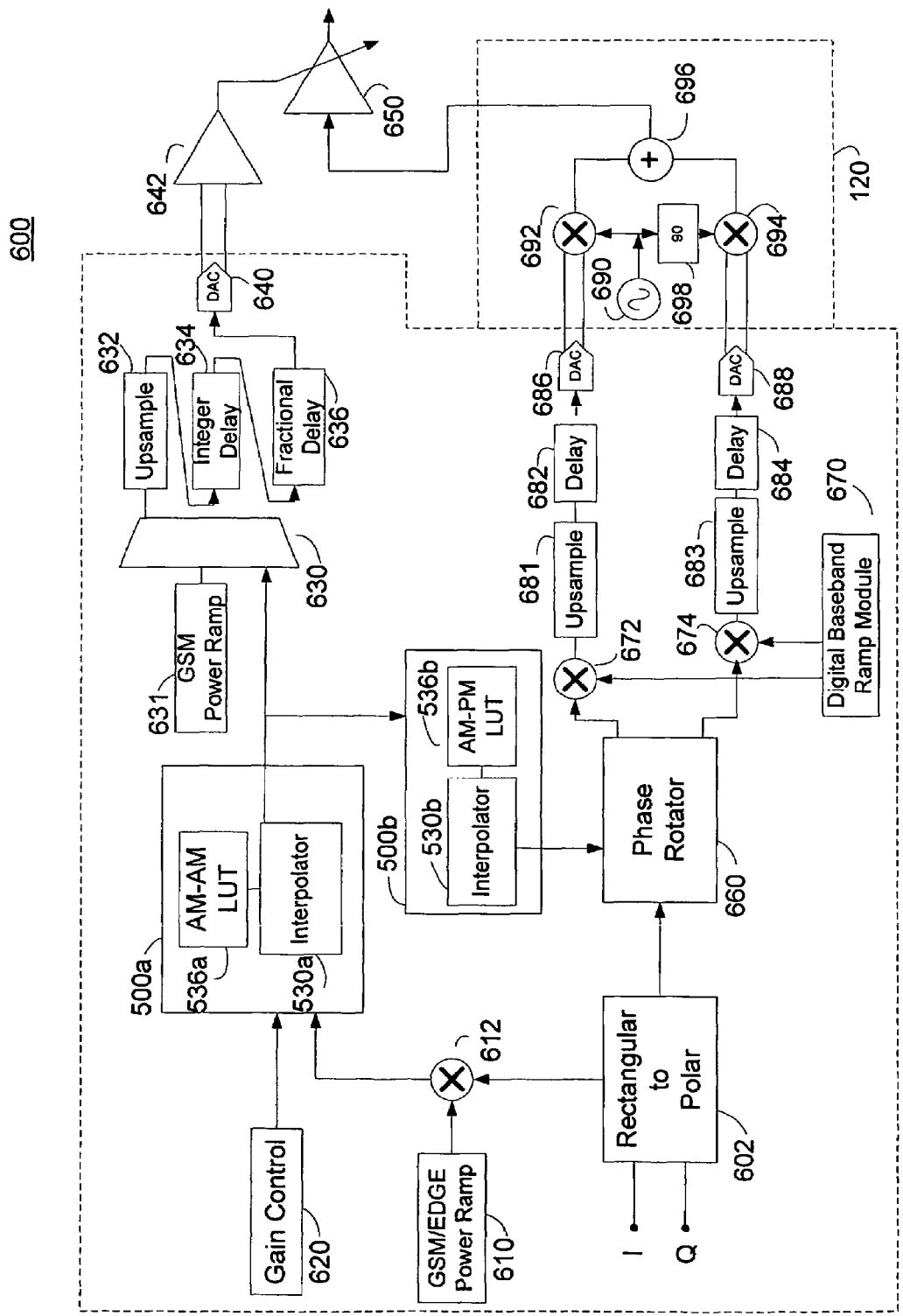
FIGS. 6A-6F are functional block diagrams of embodiments of a transmitter implementing predistortion.
Figure 6B:
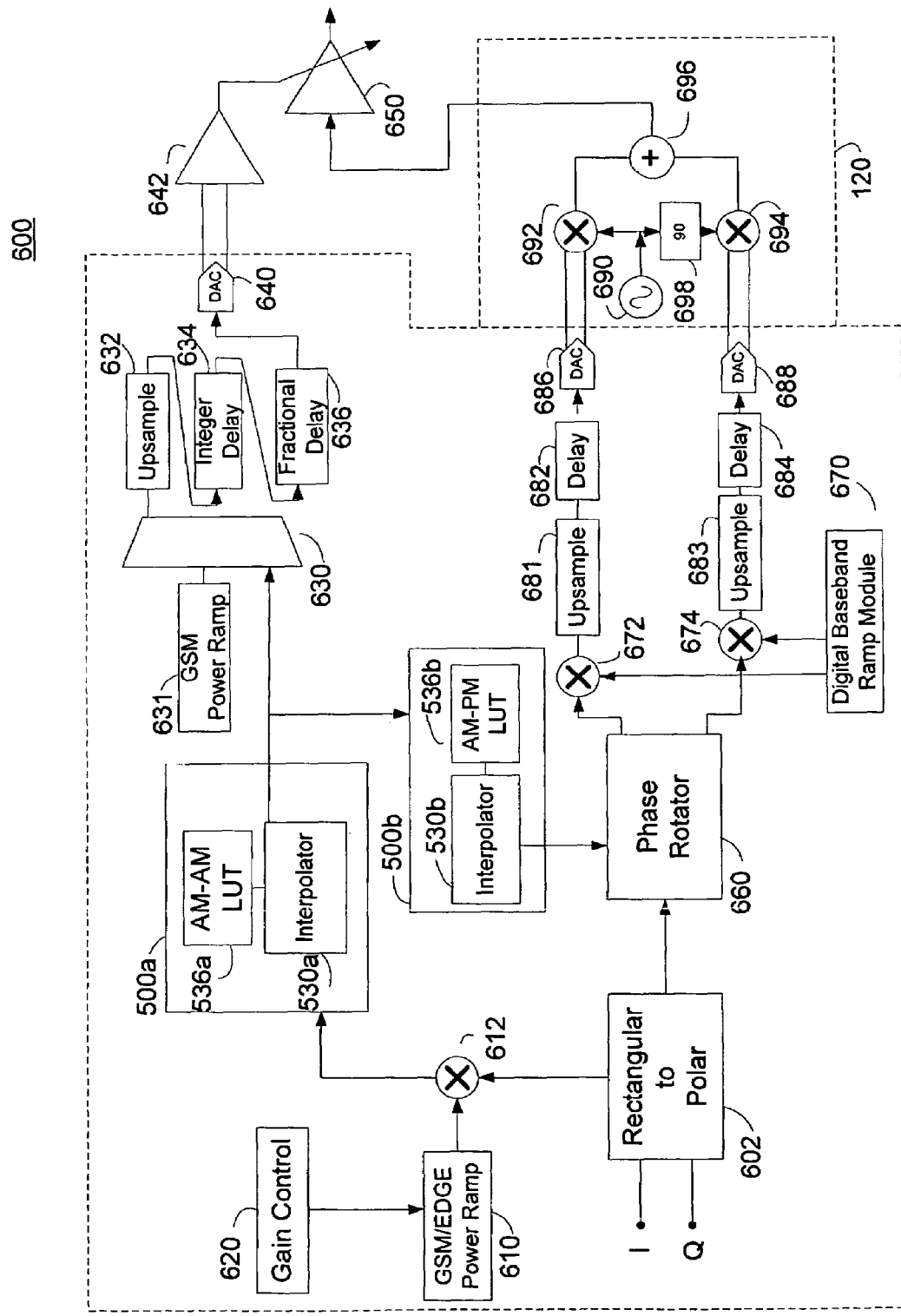
Figure 6C:
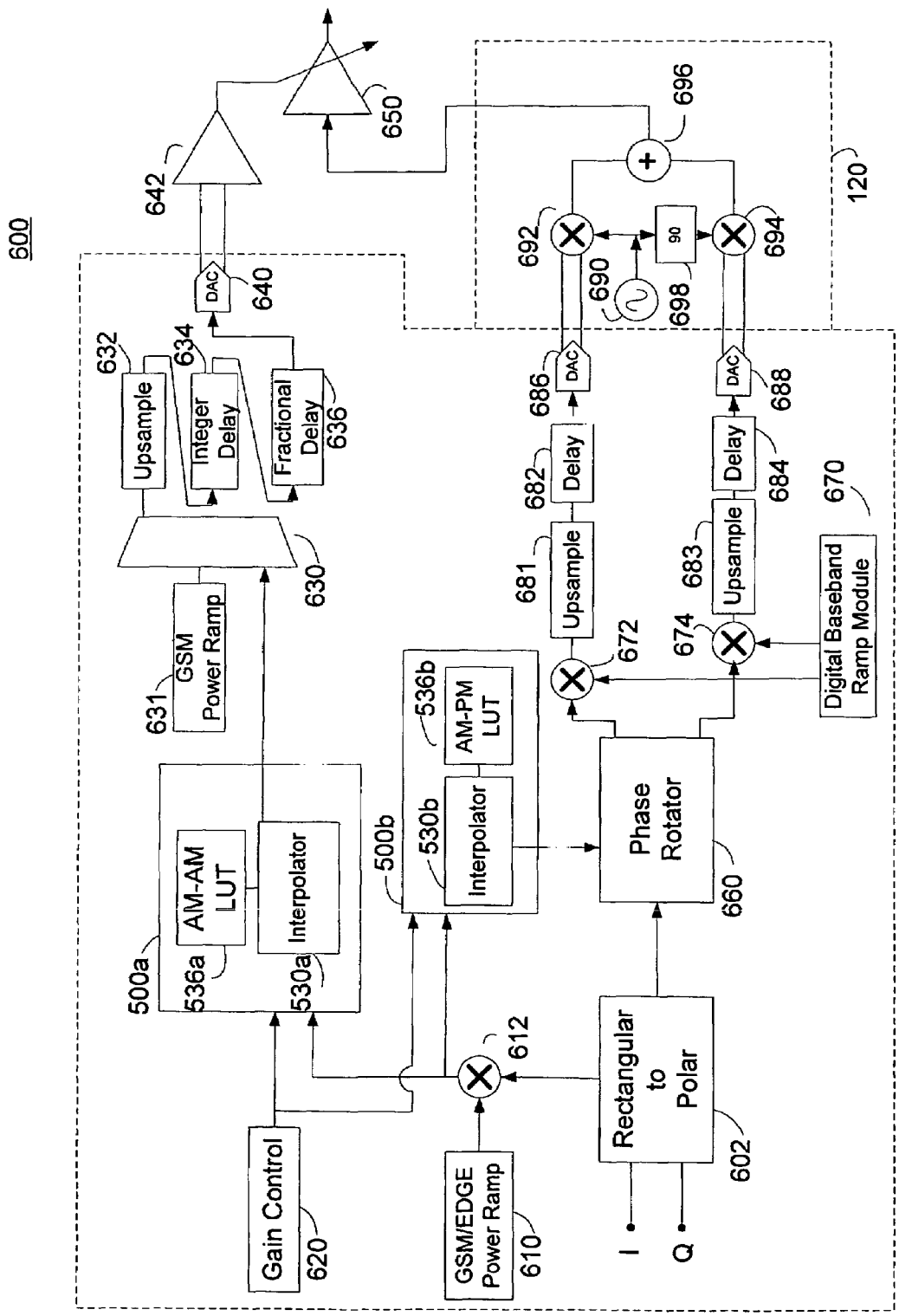
Figure 6D:
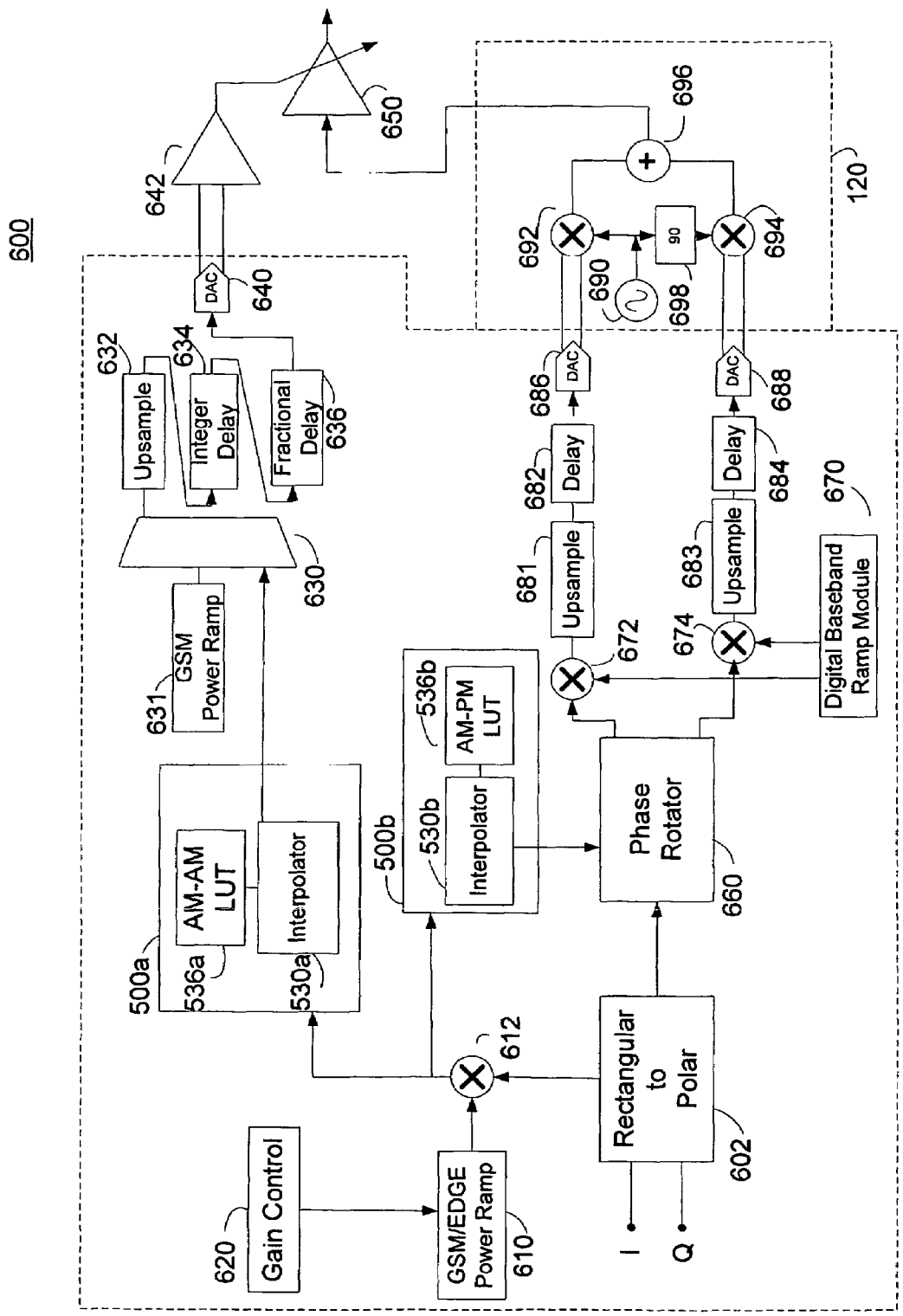

When the predistortion module 500 is configured for AM-AM predistortion, the input signal includes the amplitude envelope which may incorporate a gain control or power control setpoint, such as shown in FIGS. 6B and 6D. In another embodiment, the input to an AM-AM predistortion module 500 can include the amplitude envelope and a separate gain control signal, such as shown in FIGS. 6A and 6C. The output signal from the AM-AM predistortion module 500 represents the predistorted envelope signal.

When the predistortion module 500 is configured for AM-PM predistortion, the input signal can be the same as for the AM-AM predistortion module, as in FIGS. 6C and 6D, or can be the predistorted envelope signal, as in FIGS. 6A and 6B. The signal output from the AM-PM predistortion module 500 can represent a phase error or phase offset that can be used by a phase rotator to compensate a phasor.

In one embodiment, the predistortion module 500 can include a range select module 510 coupled to a master predistortion table 520. The master predistortion table 520 can be configured to store the entire characterization curve. As discussed previously, the characterization curve can be stored in any one of various embodiments, including, but not limited to, a predetermined number of points, a polynomial curve, a plurality of piecewise linear portions, a plurality of piecewise linear polynomials, and the like.

In one embodiment, the range select module 510 receives the power control setpoint value, which can be a gain control value, and determines a portion of the characterization curve stored in the master predistortion table 520 corresponding to that power control setpoint value. The range select module 510 can then retrieve at least a portion of the characterization curve from the master predistortion table 520 and write the portion into a look up table 536 in an interpolator 530.

The interpolator 530 can be configured to interpolate between two or more points stored in a look up table 536. The interpolator 530 can include a processor 532 coupled to memory 534 configured to perform the interpolation. The output of the interpolator 530 can represent the predistorted signal, when the predistortion module 500 is configured for AM-AM predistortion, and can represent the phase offset or phase correction when the predistortion module 500 is configure for AM-PM predistortion. A more detailed description of predistortion module 500 embodiments is provided below.

The predistortion module 500 can be configured to receive a power control setpoint and the envelope signal for the amplifier module as the input signals. The power control setpoint can correspond to a nominal output power desired from a transmitter. The power control setpoint can be coupled to an input of the range select module 510. The envelope signal can represent the AM about the power control setpoint, and is coupled as an input signal to the interpolator 530.

The range select module 510 can be configured to determine, based in part on the value of the power control setpoint, one of a plurality of predetermined ranges stored in the master predistortion table 520. In one embodiment, the predistortion module 500 can be configured to store a plurality of characterization curves in the master predistortion table 520 corresponding to a plurality of overlapping ranges.

Each of the stored characterization curves can be optimized for a particular range of power control setpoint values. For example, in a first range the gain of an amplifier module may be relatively linear and the characterization curve corresponding to the range may have a minimal number of points. However, in a second range the gain of the amplifier module may vary nonlinearly and the corresponding characterization curve for the range may have a relatively large number of points. Therefore, to minimize the storage requirements for the look up table, a plurality of overlapping characterization curves may be stored, with each curve optimized for a particular range. In other embodiments a single characterization curve may be used and the range select module 510 can be omitted. In still other embodiments, the envelope signal may incorporate the power control setpoint and the interpolator 530 may be configured to perform the range selection. Therefore, the range select module 510 may be omitted in the configuration.

The range select module 510 may determine the appropriate section or portion of the characterization curve stored in the master predistortion table 520 and may also provide a signal to the interpolator 530 to indicate the active characterization curve. The range select module 510 can write the portion of the characterization curve into the look up table 536. Alternatively, the interpolator 530 can receive a signal from the range select module 510 and write the portion of the characterization curve into the look up table 536. The interpolator 530 receives the envelope signal and looks up the nearest value in the look up table 536 corresponding to the envelope signal value.

If the control voltage value is not stored in the look up table 536, the interpolator 530 can be configured to interpolate between two bounding values stored in the look up table 536. In one embodiment, the interpolator 530 can be configured to perform a linear interpolation between the nearest stored values that are above and below the desired control voltage value. In other embodiments, the interpolator 530 can be configured to perform a curve fit using two or more stored values. In still other embodiments, the interpolator 530 can implement some other type of interpolation technique.

The output of the interpolator 530 represents the predistorted envelope signal value when the predistortion module 500 is configured for AM-AM predistortion, and represents the phase offset when the predistortion module 500 is configured for AM-PM predistortion.

FIG. 5B is a functional block diagram that shows an embodiment of how the master predistortion table 520 can be generated for either AM-AM or AM-PM predistortion. In the embodiment shown in FIG. 5B, the master predistortion table 520 includes a nominal measured response table 526, a frequency compensation table 522, a temperature compensation table 524, and a battery voltage compensation table 528. The values of the nominal measured response table 526, the frequency compensation table 522, the temperature compensation table 524, and the battery voltage compensation table 528 are summed in a signal summer 540 and correspond to the values in the master predistortion table 520 for the particular temperature, frequency, and battery voltage conditions. Other embodiments may use additional, or fewer, correction tables.

The additional frequency compensation table 522, temperature compensation table 524, and battery voltage compensation table 528 can be used to further increase the accuracy of the master predistortion table 520. The values stored in, for example, the AM-AM look up table can represent the gain characterization curve for an amplifier module at a particular frequency and at a particular temperature. For example, the nominal measured response table 526 may store the measured response curve for a frequency that is approximately the center of an operating frequency band. Additionally, the characterization curve stored in the nominal measured response table 526 may have been determined at a typical operating temperature, such as 25° C.

However, the characterization curve may be slightly different for different frequencies, different temperatures, or different battery voltages. For example, the gain of an amplifier module may become nonlinear at lower power levels for higher temperatures. Therefore, the temperature compensation table 524 may be configured to store offsets or corrections to the characterization curve stored in the nominal measured response table 526 for one or more temperatures. The temperatures may be determined directly using a temperature sensor (not shown) or by some indirect technique. Similarly, the frequency compensation table 522 can be configured to store corrections or offsets to the characterization curve for one or more frequencies. For example, the frequency compensation table 522 may store correction data for a frequency near the lower end of the operating band and correction data for a frequency near the upper end of the operating band. Similarly, the battery voltage compensation table 528 can be used to store correction data corresponding to different battery voltages.

It may be convenient for the frequency compensation table 522, the temperature compensation table 524, and battery voltage compensation table 528 to store offsets or corrections rather than storing numerous individual characterization curves for different temperatures, frequencies, and voltages. The use of offset or compensation values allows the compensation values to be summed with the nominal value stored in the nominal measured response table 526.

FIG. 6A is a functional block diagram of a transmitter 600 implementing predistortion to compensate for both AM-AM distortion as well as AM-PM distortion. The transmitter 600 is configured as a wireless communication transmitter configured to transmit GSM GMSK and EDGE signals. However, the predistortion techniques and apparatus are not limited to GSM and EDGE, but can be used to predistort signals in devices configured for other modulation schemes including, but not limited to, cdma2000, IMT 2000, Orthogonal Frequency Division Multiplexing (OFDM), and the like, and other communication standards. The block diagram shows the functional blocks that are associated with predistortion and omits other functional blocks for the sake of clarity. The transmitter 600 can be loosely divided into a digital portion and an analog portion.

The digital portion can include a digital baseband portion that performs the majority of the signal processing and predistortion. The digital baseband portion of the transmitter 600 can be implemented within an integrated circuit such as an Application Specific Integrated Circuit (ASIC). The analog portion can include baseband or Intermediate Frequency (IF) portions and can include RF portions. For example, in one embodiment the analog portion performing the frequency conversion from baseband to an RF output frequency can be performed in an RF IC. The frequency conversion can be performed according to one of any frequency conversion techniques, including OPLL, dual conversion, direct conversion, or some other technique. A power amplifier module having variable gain can be coupled to the output of the RFIC and can be configured to drive the output signal to the desired power level.

The transmitter 600 is configured to predistort amplitude and phase components of a polar representation of a baseband signal. The transmitter 600 is configured to compensate the amplitude envelope using AM-AM predistortion and is configured to compensate the phase component using AM-PM predistortion.

The digital baseband portion can include a rectangular to polar converter 602 that is configured to convert a rectangular input signal to a polar coordinates having a magnitude component and a phasor with a normalized magnitude. For example, a digital baseband signal can be configured as a quadrature signal having I and Q components. The quadrature signal is converted to polar coordinates in the rectangular to polar converter 602.

The magnitude component output from the rectangular to polar converter 602 represents the amplitude envelope of the baseband signal. The magnitude component of the polar signal is coupled to an input of a multiplier 612. A power ramp module 610 is coupled to a second input of the multiplier 612. The power ramp module 610 is configured to scale the envelope signal to conform to a predetermined power time envelope mask. The power ramp module 610 can be configured, for example, to provide a GSM or EDGE power ramp for the signal in order to conform to requirements such as those shown in FIG. 2A. The power ramp module 610 is configured to scale the envelope signal. The output of the multiplier 612 is coupled to an input of a first predistortion module 500a configured to provide AM-AM predistortion.

The output of a gain control module 620 is also coupled to an input of the first predistortion module 500a configured to provide AM-AM predistortion. The first predistortion module 500a can be configured, for example, as the predistortion module of FIG. 5A. The first predistortion module 500a can determine a range of a characteristic curve based on the value of the input signal provided by the gain control module 620. The first predistortion module 500a can store in a look up table 536a a portion of a characterization curve for an amplifier module 650 retrieved from a master predistortion table (not shown). The first predistortion module 500a can also include an interpolator 530a that is configured to receive the power ramped envelope signal from the multiplier 612, determine from the look up table 536a an amount of compensation or an amount of distortion, and apply predistortion to the power ramped envelope signal.

The predistorted output from the first predistortion module 500a is then coupled to an input of a multiplexer 630 and an input of a second predistortion module 500b. The multiplexer 630 can be configured to select one of a plurality of envelope signals to be applied to the amplifier module 650. For example, the multiplexer 630 can be controlled to select one of a plurality of input signals based on a transmitter 600 mode of operation.

In the embodiment shown in FIG. 6A, the output of the first predistortion module 500a is coupled to an input of the multiplexer 630. A GSM power ramp module 631 can also be coupled to an input of the multiplexer 630. The GSM power ramp module 631 can be configured to provide a power time envelope mask for a GSM mode of operation. Additional modules or control signals may be coupled to additional inputs of the multiplexer 630 and may be selected for appropriate operating modes.

The output of the multiplexer 630 can be coupled to an upsampler 632 that is configured to upsample the envelope signal provided by the multiplexer 630. The upsampler 632 can be used to improve the SNR at the power amplifier input and eases analog filtering requirements following the digital to analog conversion. The upsampler 632 can also be used to provide finer resolution for delay matching modules. An integer delay module 634 can be coupled to the output of the upsampler 632 and can be configured to delay the predistorted amplitude envelope by an integer number of clock cycles. The output of the integer delay module 634 is coupled to a fractional delay module 636 that can be configured to delay the predistorted amplitude envelope by a fraction of a clock cycle. The integer and fractional delay modules 634 and 636 can be configure to introduce a delay that allows the predetermined envelope signal to be synchronized with a phase signal. The output of the fractional delay module 636 can be coupled to a power control Digital to Analog Converter (DAC) 640 that is configured to convert the digital signal to an analog representation.

The analog output of the power control DAC 640 is coupled to a signal amplifier 642. The output of the power control DAC 640 can represent one output from a digital baseband processor. The output of the power control DAC 640 may be, for example, a differential signal. The power control DAC 640 may have a differential output in order to provide noise immunity. The signal amplifier 642 can have, for example, a differential input and a single ended output, and can be configured as a buffer with unity gain or an amplifier with gain. The output of the signal amplifier 642 is coupled to a power control input of the amplifier module 650.

The normalized phasor output from the rectangular to polar converter 602 can be predistorted in a manner similar to the manner in which the magnitude or envelope signal is predistorted. The phasor output from the rectangular to polar converter 602 is coupled to an input of a phase rotator module

660. The phase rotator module 660 may be, for example, a CORDIC with a phase correction input.

The phase rotator module 660 can include another input that receives the phase compensation from the second predistortion module 500b. As discussed above, the second predistortion module 500b can be coupled to the output of the first predistortion module 500a. The second predistortion module 500b can be configured to store a phase characterization curve such as the curve shown in FIG. 4. The characterization curve can be stored in an AM-PM look up table 536b and used by an interpolator 530b to determine an amount of phase compensation to be applied to the phasor.

The second predistortion module 500b couples the output phase compensation value to the phase rotator module 660. The phase rotator module 660 can then predistort the phase signal by rotating the phasor by the amount of phase compensation.

The phase rotator module 660 can also be configured to convert the phase compensated phasor to rectangular coordinate system by generating corresponding I and Q signal values. The in phase signal output from the phase rotator module 660 can be coupled to an in phase multiplier 672 and the quadrature signal output from the phase rotator module 660 can be coupled to a quadrature multiplier 674. A digital baseband ramp module 670 can be configured to drive inputs on the in phase and quadrature multipliers 672 and 674 and can scale the phasor signals, for example, depending on system timing. The scaled I and Q signals output from the in phase and quadrature multipliers 672 and 674 are coupled to respective in phase and quadrature upsamplers 681 and 683. The outputs of the upsamplers 681 and 683 are coupled, respectively, to I and Q delay modules 682 and 684.

The in phase and quadrature delay modules 682 and 684 can be configured to the I and Q delay of the phase signal path to the delay experienced by the envelope signal. The output of the in phase and quadrature delay modules 682 and 684 are coupled to respective in phase and quadrature DACs 686 and 688. The in phase and quadrature DACs 686 and 688 are configured to convert the digital signals to analog representations. The DACs 686 and 688 may, for example, generate differential analog output signals in order to increase signal noise immunity.

The outputs from the DACs 686 and 688 are coupled to an upconverter module, which can perform upconversion in any of a variety of ways. In the embodiment of FIG. 6A, the output of the DACs 686 and 688 are coupled to respective in phase and quadrature mixers 692 and 694. A local oscillator (LO) 690 configured to generate a LO is coupled to an LO input of the in phase mixer 692. The LO 690 is also coupled to a phase shifter 698 configured to generate a quadrature LO signal. The quadrature LO signal can be coupled to the LO input of the quadrature mixer 694. The output of the in phase mixer 692 and the output of the quadrature mixer 694 can be coupled to respective inputs of a signal summer 696 that is configured to sum the two signal components to generate a composite signal. The composite signal is provided to an input of an amplifier module 650.

The predistorted envelope signal controls the gain of the amplifier module 650. Thus, the amplifier module 650 amplifies the composite signal to a power level controlled by the power control setpoint. Additionally, because the gain of the amplifier module 650 is varied by the envelope signal, the output amplitude of the amplifier module 650 varies according to the signal envelope. Thus, the amplifier module 650 is AM modulated to restore the envelope to the signal.

Because the gain control voltage value of the amplifier module 650 is predistorted to compensate at least for the AM distortion contributed by the amplifier module, the output of the amplifier module 650 is corrected for AM distortion. Similarly, the phasor that generates the I and Q signal components of the composite signal input to the amplifier module 650 is compensated for PM distortion by the second predistortion module 500b and phase rotator module 660. Thus, the phase output of the amplifier module 650 is compensated for at least the PM distortion contributed by the amplifier module 650.

FIG. 6B is a functional block diagram of another embodiment of a transmitter 600 implementing AM and PM predistortion. The embodiment shown in FIG. 6B is similar to the embodiment of FIG. 6A, except for the configuration of the input signals to the first predistortion module 500a.

The output of the gain control module 620 is coupled to an input of the power ramp module 610 rather than to an input of the first predistortion module 500a. The power ramp module 610 can be configured to combine the gain control signal to the power ramp signal, for example, by summing the two signals to generate an output that is a composite gain control power ramp signal. The scaled envelope signal output from the multiplier 612 is coupled to an input of the first predistortion module 500a.

The first predistortion module 500a is configured to operate on the single input having the envelope signal scaled by the composite gain control power ramp signal. Because the first predistortion module 500a operates on a single input, range selection from a master predistortion table can be omitted. Instead, the entire master predistortion table can be stored in the look up table 536a and accessed by the interpolator 530a. The remaining portions of the transmitter 600 are the same as in FIG. 6A.

FIG. 6C is a functional block diagram of another embodiment of a transmitter 600 implementing AM and PM predistortion. The embodiment shown in FIG. 6C is similar to the embodiment of FIG. 6A, except that the second predistortion module 500b receives the same input signals as the first predistortion module 500a. That is, the second predistortion module 500b receives the output of the gain control module 620 and the scaled envelope signal from the multiplier 612.

Thus, the second predistortion module 500b can be configured to determine a range of an AM-PM characterization curve stored in a master predistortion table (not shown) based on the gain control value and load the portion of the characterization curve into the look up table 536b. The interpolator 530b can interpolate a predistortion level based on the value of the envelope signal. The remainder of the transmitter 600 is the same as in FIG. 6A.

FIG. 6D is a functional block diagram of another embodiment of a transmitter 600 implementing AM and PM predistortion. The embodiment shown in FIG. 6D is similar to the embodiment of FIG. 6B, except that the second predistortion module 500b receives the same input signals as the first predistortion module 500a. Therefore, the second predistortion module 500b operates on the single input having the envelope signal scaled by the composite gain control power ramp signal. The second predistortion module thus operates on the undistorted scaled envelope signal rather than the predistorted envelope signal. The remainder of the transmitter 600 is the same as in FIG. 6A.

Figure 6E:
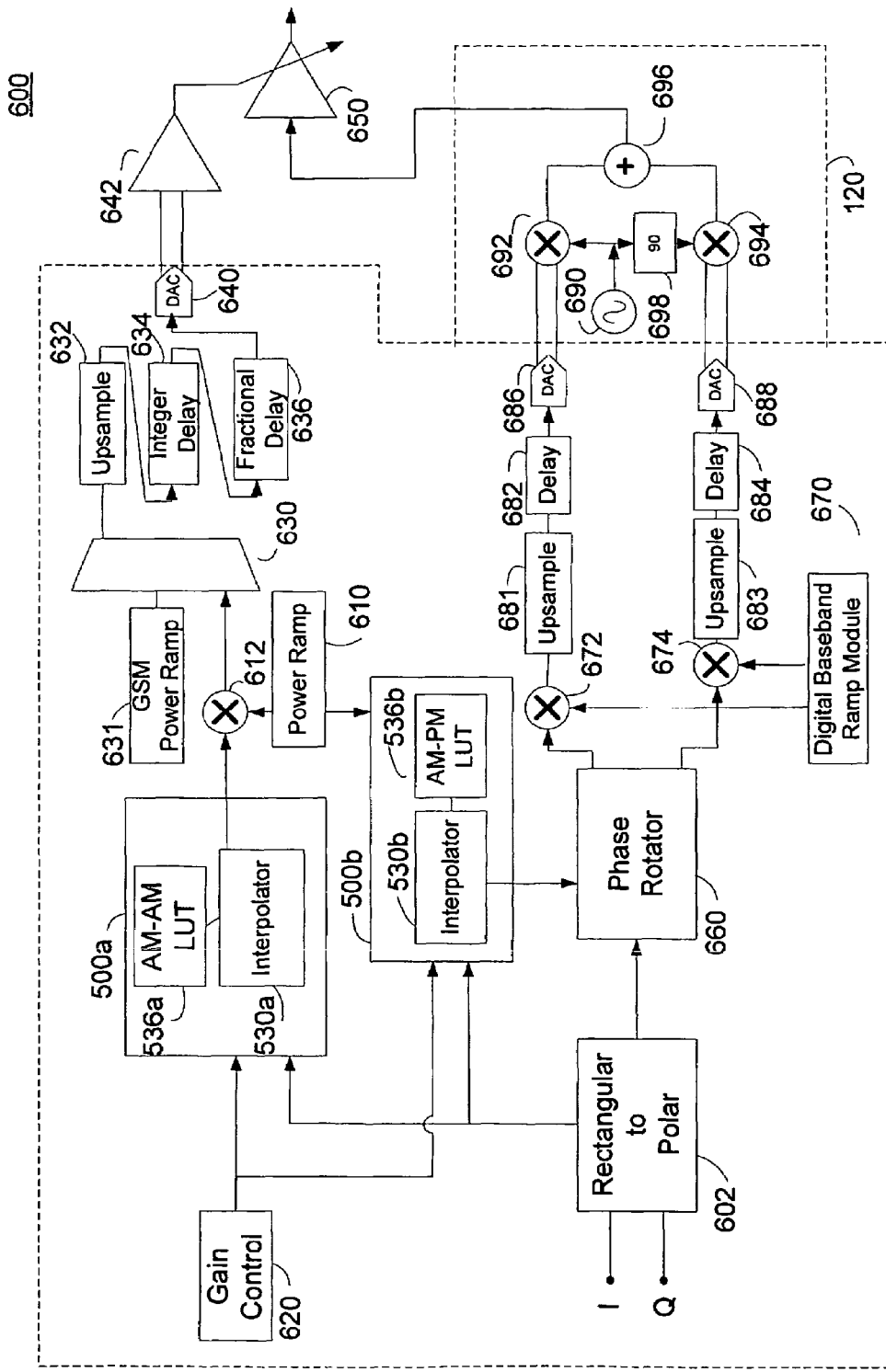

FIG. 6E is a functional block diagram of another embodiment of a transmitter 600 implementing AM and PM predistortion. The embodiment shown in FIG. 6E is similar to the embodiment of FIG. 6A, except for the manner in which the gain and power ramp are applied to the normalized signal. In the embodiment shown in FIG. 6A, the gain and power ramp are applied to the normalized signal prior to the amplitude predistortion. In the embodiment shown in FIG. 6E, the power ramp is applied to the amplitude signal following the amplitude predistortion operation.

The digital baseband portion can include a rectangular to polar converter 602 that is configured to convert a rectangular input signal to a polar coordinates having a magnitude component and a phasor with a normalized magnitude. The normalized amplitude envelope output from the rectangular to polar converter 602 is coupled to an input of the first predistortion module 500a. Previously, in the embodiment shown in FIG. 6A, the amplitude envelope was scaled by the power ramp module 610 in the multiplier 612 prior to being coupled to the first predistortion module 500a.

The envelope output from the rectangular to polar converter 602 and the output of the gain control module 620 are also coupled to the input of the second predistortion module 500b. The first predistortion module 500a operates on the input signals to predistort the envelope signal. The predistorted output from the first predistortion module 500a is coupled to an input of a multiplier 612.

The power ramp module 610 provides the power ramp signal to another input of the multiplier 612. The output of the multiplier 612 is the predistorted amplitude envelope signal scaled by the power ramp. The output of the multiplier 612 is coupled to an input of the multiplexer 630. The remainder of the amplitude signal processing can be identical to the amplitude signal processing performed by the embodiment of FIG. 6A and is omitted here for the sake of brevity.

The phase predistortion signal processing performed by the embodiment of FIG. 6E is largely identical to the phase predistortion signal processing performed by the embodiment of FIG. 6C. The difference lies in the input signals provided to the second predistortion module 500b.

As discussed previously, the amount of phase predistortion applied to compensate a phasor varies depending on the magnitude of the amplitude signal. Therefore, the second predistortion module 500b can be configured to receive the same inputs as the first predistortion module 500a as well as from the power ramp module 610. The second predistortion module 500b can use the input signals to determine the amplitude of the composite amplitude envelope signal. In another embodiment, shown in FIG. 6F, the second predistortion module 500b can receive as an input the output of the multiplier 612, which is the composite amplitude envelope signal.

Figure 6F:
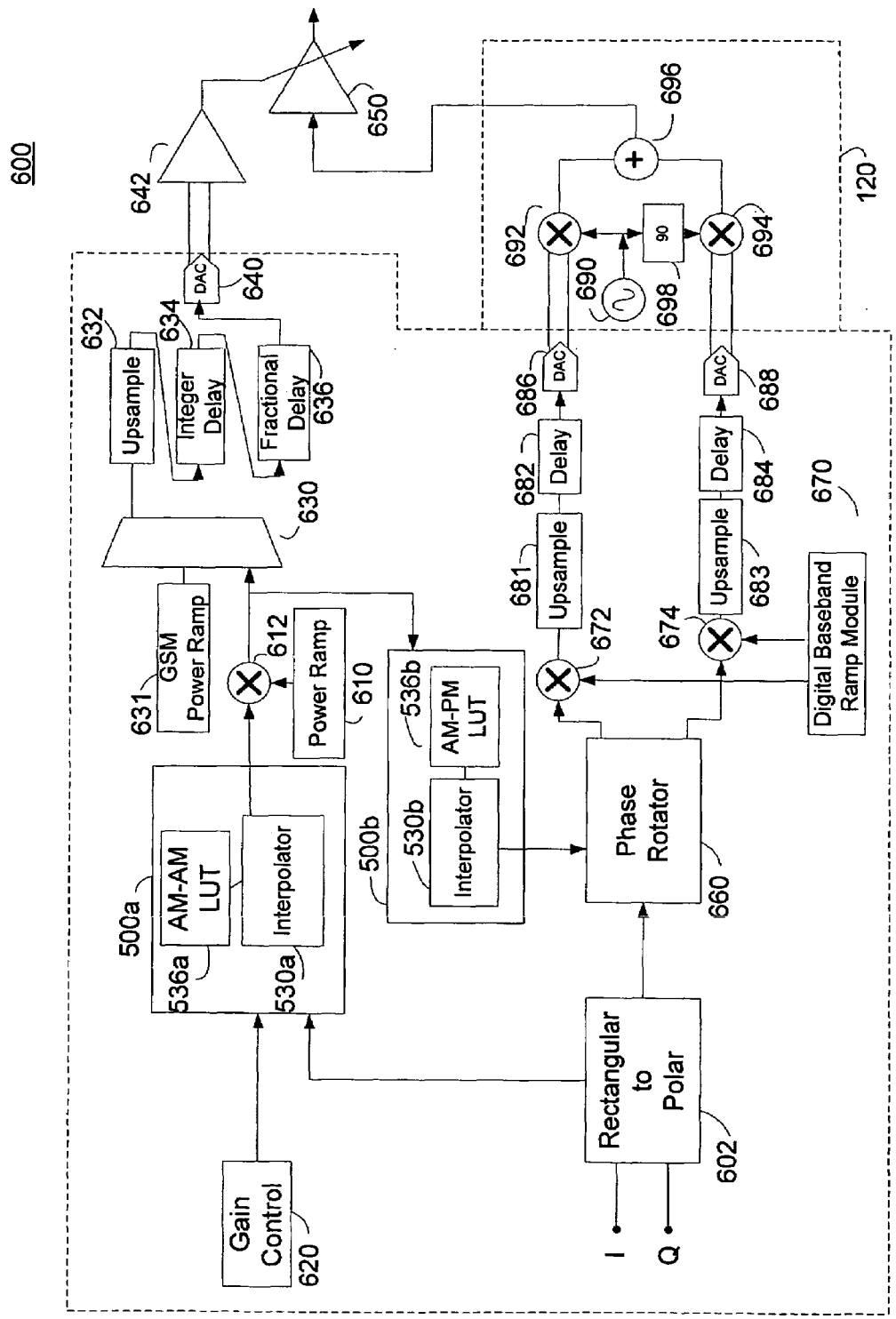

The second predistortion module 500b provides a control signal to the phase rotator module 660. The remainder of the phase predistortion signal processing performed by the embodiments of FIGS. 6E and 6F are the same as the phase predistortion signal processing performed by the embodiment of FIG. 6A, and the description is omitted for purposes of brevity.

Figure 7:
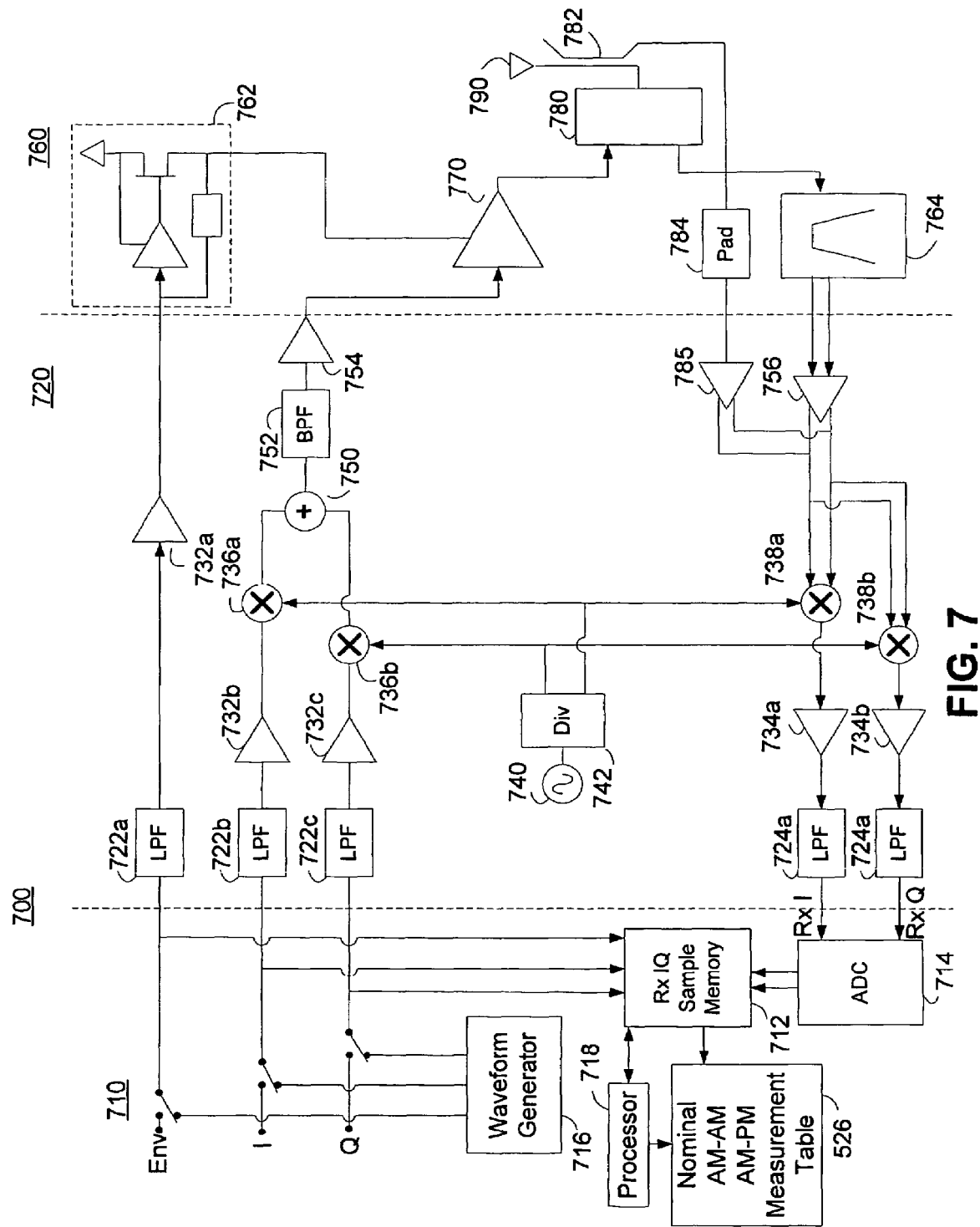
FIG. 7 is a functional block diagrams of an embodiment of an amplifier autocalibration system.

FIG. 7 is a functional block diagram of an embodiment of an amplifier autocalibration system. In FIG. 7, the autocalibration system is implemented using an upconverter and a calibration downconverter sharing the same local oscillator. The upconverter and calibration downconverter can be implemented with the blocks of a transceiver 700. The transceiver 700 can be, for example, a wireless telephone such as a wireless phone configured to operate in accordance with the GSM standard.

The transceiver 700 can include a baseband processor 710 coupled to an RF portion 720. The RF portion 720 can also be coupled to a PA/Frontend portion 760. The baseband processor 710 can be, for example, the baseband processor of FIGS. 6A through 6F. The baseband processor 710 can be, for example, implemented as a single baseband integrated circuit.

The baseband processor 710 can includes a waveform generator 716, a processor 718, one or more nominal AM-AM or AM-PM measurement tables 526, and an Rx IQ sample memory 712. The processor 718 can be coupled to the Rx IQ sample memory 712 and can operate on the sample memory contents to produce the nominal measurement table 526. The nominal measurement table 526 can include the AM-AM and AM-PM look up tables 536a and 536b shown in the baseband processors of FIGS. 6A though 6F, and may include the master predistortion table shown in FIGS. 5A and 5B.

The baseband processor 710 can include a waveform generator 716 that can be configured to generate an envelope signal and normalized I and Q signals that are typically part of a transmitter path of the transceiver 700. The output of the waveform generator 716 can be selectively coupled to the I, Q, and envelope signal lines of the baseband processor 710. The envelope, I and Q signals can also be coupled to inputs of the Rx IQ sample memory 712. The Rx IQ sample memory 712 can also include inputs configured to couple with outputs of an ADC 714 coupled to received I and Q signals that are typically recovered in a receive path of the transceiver 700.

The RF portion 720 can include the frequency conversion and intermediate amplification stages for the transmit and receive signal paths. The RF portion 720 can be implemented, for example, in a single integrated circuit.

In the embodiment shown in FIG. 7, the RF portion 720 includes a first lowpass filter (LPF) 722a that is configured to receive and filter the envelope signal from the baseband processor 710. The output of the first LPF 722a is coupled to an envelope amplifier 732a configured to provide intermediate amplification to the envelope signal.

The RF portion 720 also includes second and third LPFs 722b and 722c that are configured to receive and filter the I and Q signals, respectively, from the baseband processor 710. The outputs of the second and third LPFs 722b and 722c are coupled, respectively, to I and Q amplifiers 732b and 732c. The outputs of the I and Q amplifiers 732b and 732c are coupled, respectively, to I and Q mixers 736a and 736b that are configured to frequency convert the I and Q signals. The Local Oscillator (LO) inputs of the I and Q mixers 736a and 736b are driven by LO signals generated by an LO 740 driving a signal splitter 742 that can also be configured to introduce a ninety degree phase shift. Of course, some other upconversion technique can be used in the transceiver 700.

The frequency converted outputs from the I and Q mixers 736a and 736b are coupled to a signal summer 750 that sums the I and Q signal components. The output of the signal summer 750 is coupled to a bandpass filter 752 and an AGC amplifier 754.

The amplified envelope and quadrature signals output by the transmit path of the RF portion can be coupled to the power amplifier of the PA/Frontend portion 760. The envelope signal from the envelope amplifier 732a of the RF portion 720 can be used to control a bias section 762 of a power amplifier 770. The quadrature signal component can couple to an input of the power amplifier 770. The output of the power amplifier 770 can be coupled to a switch 780 that can be configured to selectively couple an antenna 790 to a transmit or receive path of the transceiver 700. The switch 780 can also be referred to as a switchplexer because it can be viewed as multiplexing the transmit and receive operations by switching the desired signal path to the antenna 790.

The receive path of the transceiver 700 includes a receive filter 764 that can be, for example, a GSM receive SAW filter. The receive filter 764 can also be configured to convert the received signal into a differential signal.

The RF portion 720 frequency converts the received differential signals for processing in the baseband processor. The received differential signals are coupled to a receive amplifier 756 which drives receive I and Q mixers 738a and 738b, respectively. The LO ports of the receive I and Q mixers 738a and 738b are driven by the same LO 740 and signal splitter 742 used for the transmit path. The receive I and Q mixers 738a and 738b output the received I and Q baseband signals.

The I and Q baseband signals are amplified in baseband amplifiers 734a and 734b, respectively, and then are filtered in I and Q baseband filters 724a and 724b, respectively. The filtered I and Q baseband signals are coupled to the baseband processor 710 where they are coupled to an ADC 714 and from the ADC 714 to inputs of the Rx IQ sample memory 712.

The transceiver AM-AM and AM-PM distortion can be calibrated by generating a calibration signal in the baseband processor 710 and sending it through the transmit path of the transceiver 700. The transmit calibration signal can then be monitored using the receive path of the transceiver 700.

The transceiver 700 includes a coupler 782 and attenuator 784 that are configured to directly couple the transmit signal at a predetermined coupling level. The coupler 782 can be, for example, a directional coupler. The output of the attenuator 784 can be coupled to a buffer amplifier 785 on the RF portion 720. Implementing the coupler 782 and attenuator 784 in the transceiver 700 allows the designer to better constrain the coupling of the transmit signal. Additionally, the transmit signal may be routed to omit the receive filter 764, which may be a narrow band SAW filter. The calibration process does not rely on the transmit leakage path, which may be so attenuated as to impair the ability to calibrate lower power levels. Although the coupler 782 is shown as coupling the output of the switch 780 at the input to the antenna 790, the coupler 782 may also be positioned at the input of the switch 780, near the output of the power amplifier 770.

Additionally, although the calibration process is described using an integrated receiver, the calibration process may operate using an external receiver that is configured to couple a signal from the output of the transmitter and provide a receive signal to the input of the RX sample memory 712, such as by coupling to the input of the ADC 714. The external receiver can be configured to use the same LO signal as the transmitter.

The transceiver 700 can also be configured to take advantage of any transmit leakage occurring in the PA/Frontend portion 760 to couple the transmit calibration signal to the receive signal path. The transmit leakage may be, for example, on the order of 50 dB below the transmit power level.

In one embodiment, calibration of the AM-AM and AM-PM distortion of the transceiver 700 can be performed by initially generating a known calibration signal, which may use a predetermined signature code, using the baseband processor 710. The baseband processor 710 may set the envelope signal to a predetermined level corresponding to a predetermined transmit power level. The baseband processor 710 can couple the envelope signal and the I and Q signal components of the calibration signal to inputs of the Rx IQ sample memory 712.

The RF portion 720 can be configured to frequency convert the calibration signal to a known frequency, which can be, for example, a transmit frequency or a receive frequency of the transceiver 700. The RF portion 720 couples the frequency converted calibration signal to the PA/Frontend portion 760 where the signal is amplified according to the envelope signal applied to the PA bias section 762.

By way of the coupler 782, attenuator 784, and buffer amplifier 785, or due to transmitter leakage, some of the transmit signal is coupled to the receive signal path of the transceiver 700. The output of the buffer amplifier 785 can be coupled to the inputs of the mixers 738a and 738b, while the transmitter leakage signal is coupled by the receive filter 764 to the receive signal path of the RF portion 720. The RF portion 720 frequency converts the signal back to baseband I and Q signals. The baseband I and Q signals are coupled to the baseband processor 710 where they are coupled to the ADC 714 and the receive I and Q inputs of the Rx IQ sample memory 712.

The Rx IQ sample memory 712 can build a measurement curve using the received I and Q signals as the outputs of a function having the I and Q signals of the waveform generator 716 as the input. The baseband processor 710 can store measured values in the Rx IQ sample memory 712, and can use the processor 718 to further process the values to generate the nominal measurement table 526 values.

The baseband processor 710 can also store a received signal power relative to a predetermined power. The predetermined power can be, for example, full PA power. In an embodiment, the full PA power can be measured using a power meter (not shown) coupled external to the transceiver 700.

The baseband processor 710 can repeat the calibration process for a predetermined number of envelope signals to fully characterize the transceiver 700. The baseband processor 710 can time vary the phase of the calibration signal to time align the I and Q signal paths.

Although the calibration process can be performed completely autonomously, it may be advantageous to separately calibrate the receive imbalance by receiving a tone of known phase and determining the phase imbalance of the receive path. The transceiver 700 can thus more accurately attribute imbalances to the imbalances in the transmit path.

Although the calibration process described herein can be adapted for use with any of the embodiments shown in FIGS. 6A-6F, it may be advantageous to use a configuration in which the AM-PM predistortion module receives the predistorted envelope signal as the input. In such a configuration, the AM-PM predistortion is merely the negative of the measured phase.

Thus, as an example, a power meter can be coupled to the transmit output of the transceiver 700. The waveform generator 716 can be configured to generate a constant phasor signal for the I and Q inputs. The waveform generator 716 can also be controlled to increase the amplitude of the envelope signal until the power meter senses a maximum output power from the power amplifier 770. The output of the ADC 714 can be read to determine a corresponding reference point. The remainder of the power readings can then be determined relative to the maximum power reading.

The waveform generator 716 can be configured to maintain a constant phasor value at the I and Q lines. This corresponds to providing a DC value to each of the I and Q lines. The waveform generator 716 can then be configured to provide an envelope signal value that corresponds to an output power less than the maximum output power.

The receive path processes the signal and the ADC 714 converts the recovered Rx I and Rx Q signals. These signals are coupled to the Rx IQ sample memory 712 and represent the output characteristic for a given input. Thus, thus the receive signal path determines a phase and amplitude corresponding to a given phase and envelope signal provided by the waveform generator 712. A single Rx I and Rx Q measurement may be used or a number of measurements can be averaged to average thermal and phase noise contributions. The waveform generator 712 can then generate another envelope signal and the transceiver can repeat the process until sufficient characterization curves are determined.

As discussed above, more accurate calibration can be achieved if any receive phase imbalance is removed or compensated prior to performing calibration. Additionally, to further improve the accuracy of the calibration process, receive DC offset, and signal contributions attributable to leakage from the input of the power amplifier 770 to the receive signal path need to be accounted for.

The receive phase imbalance can be corrected, for example, using an external signal generator coupled to the receiver input and configured to provide a signal with a known phase. Alternatively, the waveform generator 716 can be configured to generate a predetermined waveform and the I and Q paths of the receiver can be adjusted to achieve a minimal residual sideband component.

The leakage from the input of the power amplifier 770 to the receive path contributes to inaccuracies in the calibration. The effect of the PA input leakage is to add a DC offset to the receive calibration signal. Thus, the DC offset attributable to PA input leakage and Rx DC offset can both be compensated using the same measurement. The power amplifier 770 can be disabled while the waveform generator 712 provides a strong signal to the input of the power amplifier 770. Any resultant signal at the output of the ADC 714 can be attributable to the DC offset and PA input leakage. The characterization curves can be compensated for this signal contribution.

The above calibration process assumes that the receive path gain remains constant. However, the dynamic range of the receiver, and particularly the ADC 714, may not be sufficient to allow a characterization curve to be measured with a single receive gain. Thus, the receive signal path gain may be adjusted one or more times during the course of calibration. Because the contribution to PA input leakage and DC offset can vary depending on the level of receive gain, the measurement and correction of these contributors should be repeated for each receive gain setting used during calibration.

The timing alignment of the envelope signal relative to the phasor is an important performance characteristic of the transmitter. The delays in the envelope signal and phase signal paths can be adjusted to time align the signal paths. These delay modules are shown in the embodiments of FIGS. 6A-6F. The signal paths can be aligned using the RX calibration path or using external equipment.

The waveform generator 716 can be configured to generate a known waveform that changes phase and amplitude over time, such as a sine wave. If external equipment is used, the external equipment can be synchronized to the output of the waveform generator 716 and can be configured to monitor the transmitter output. The delay modules can then be varied to time align the signal paths.

If the Rx calibration path is used, the output of the waveform generator 716 at the Rx IQ sample memory 712 can be compared against the received signals from the output of the ADC 714. The delay modules can be adjusted to time align the transmit signal paths.

Although the results of the calibration process may be used directly as the characterization curves stored in master predistortion tables, it may be advantageous to further process the calibration data. Additional processing can be used to smooth the characterization curves to remove small errors that have disproportionate impact on the quality of the predistorted signals.

For example, when characterizing the AM-AM distortion, small amplitude measurement errors at high signal powers disproportionately can degrade the output RF spectrum of a signal that is predistorted using the characteristics. This may be attributable to the relatively shallow slope of the gain curve for a power amplifier at high power levels. Similarly, when measuring the AM-AM or AM-PM characteristic curves, the measurements are affected by noise, such as thermal noise or phase noise.

Therefore, to compensate for small measurement errors that can potentially contribute to degradations in the predistorted output RF spectrum, the measured characteristic curves can be processed to smooth out small measurement errors. One approach, previously discussed, is to utilize piecewise cubic (third order) curve fitting to the measured distortion characteristics.

Because continuity at each of the measurement points may be desirable, a spline curve fit may be advantageous. The characteristic curves can use measurement points that correspond roughly to 0.5 dB steps in output power. The AM-AM and AM-PM characteristic curves can be fit using the same basis splines if the slopes of the two curves are somewhat correlated.

Figure 8:
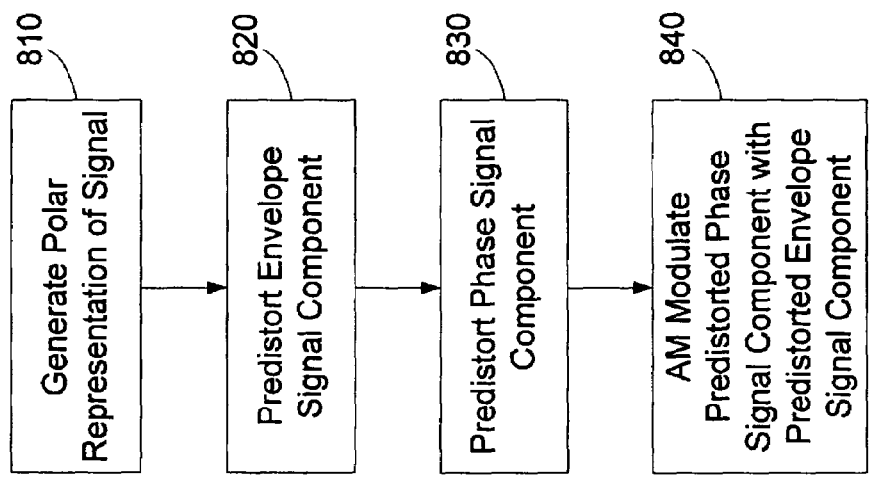
FIG. 8 is a flowchart of an embodiment of a predistortion process.

FIG. 8 is a flowchart of an embodiment of a predistortion process 800. The process 800 can be performed, for example, by the transmitter of FIG. 6A or 6B. The transmitter begins the process 800 at block 810 by generating a polar representation of a signal. The polar representation includes an envelope signal component that can represent the signal magnitude and a phase signal component that can be a normalized phasor used to represent the phase component. The transmitter then proceeds to block 820 and predistorts the envelope signal component. The transmitter then proceeds to block 830 and predistorts the phase signal component. After predistorting both signal components, the transmitter proceeds to block 840 and AM modulates the predistorted phase signal component with the predistorted envelope signal component to restore the envelope to the signal. The result is a predistorted signal that, when processed by the nonlinear signal processing elements, produces a nondistorted signal.

Apparatus and methods are disclosed above for compensating signal distortion contributed during signal processing. The apparatus and methods can be configured to compensate for the signal distortion through envelope elimination and restoration combined with predistortion. The signal can be converted from rectangular coordinate system to a polar coordinate system having a magnitude and phase component.

The phase component can be predistorted to compensate for phase distortions contributed by the signal path. The compensated phase component has a normalized magnitude that does not vary. The compensated phase component can be coupled to the input of a gain stage having one or more amplifiers configured to amplify the signal for transmission.

The magnitude component can be predistorted to compensate for gain nonlinearities in the signal path. The magnitude component can then be used to control a gain of one or more amplifier stages to restore the envelope to the phase component.

A predistortion module can be implemented for each of the amplitude and phase predistortion. The predistortion module can include a range selection module that is configured to receive a nominal power control setpoint value, a look up table that is configured to store a characteristic that is to be predistorted, and an interpolator that is configured to receive the range selection, retrieve the corresponding characteristics from the look up table, and apply the predistortion to the signal.

The predistortion modules and the characteristics stored in the look up tables of the predistortion modules can be determined in a calibration routine that can be configured as an autocalibration routine. In one embodiment, a calibration signal is generated in a transmit path and coupled to a receive path. The received signal is compared against the calibration signal to determine the amount of distortion contributed to the signal. The signal comparison can be repeated for various power levels to determine distortion characteristics such as AM-AM distortion and AM-PM distortion.

The various illustrative logical blocks, modules, and circuits described in connection with the embodiments disclosed herein may be implemented or performed with a general purpose processor, a digital signal processor (DSP), a Reduced Instruction Set Computer (RISC) processor, an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any processor, controller, microcontroller, or state machine. A processor may also be implemented as a combination of computing devices, for example, a combination of a DSP and a microprocessor, a plurality of microprocessors, one or more microprocessors in conjunction with a DSP core, or any other such configuration.

A software module may reside in RAM memory, flash memory, non-volatile memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor.

The steps of a method, process, or algorithm described in connection with the embodiments disclosed herein may be embodied directly in hardware, in a software module executed by a processor, or in a combination of the two. The various steps or acts in a method or process may be performed in the order shown, or may be performed in another order. Additionally, one or more process or method steps may be omitted or one or more process or method steps may be added to the methods and processes. An additional step, block, or action may be added in the beginning, end, or intervening existing elements of the methods and processes.

The above description of the disclosed embodiments is provided to enable any person of ordinary skill in the art to make or use the disclosure. Various modifications to these embodiments will be readily apparent to those of ordinary skill in the art, and the generic principles defined herein may be applied to other embodiments without departing from the spirit or scope of the disclosure. Thus, the disclosure is not intended to be limited to the embodiments shown herein but is to be accorded the widest scope consistent with the principles and novel features disclosed herein.

What is claimed is:

1. An apparatus for calibrating a predistortion module, the apparatus comprising:
   means for generating a calibration signal;
   means for amplifying the calibration signal based in part on a value of an envelope signal to generate an amplified calibration signal;
   means for transmitting the amplified calibration signal;
   means for coupling a transmit signal that comprises the amplified calibration signal to a receive signal path;
   means for generating a distortion characteristic by comparing a received signal sample with the calibration signal; and
   means for storing the distortion characteristic in a look up table of the predistortion module to calibrate the predistortion module.

2. The apparatus of claim 1, wherein the envelope signal controls a bias section of the means for amplifying the calibration signal.

3. The apparatus of claim 1, further comprising:
   means for frequency upconverting the calibration signal; and
   means for frequency downconverting the received signal sample;
   wherein the means for frequency upconverting and the means for frequency downcoverting share a same local oscillator.

4. The apparatus of claim 1, further comprising means for compensating for receive phase imbalance.

5. The apparatus of claim 1, further comprising means for compensating for leakage from an input of the means for amplifying to the receive signal path.

6. An apparatus for calibrating a predistortion module, comprising:
   a waveform generator that generates a calibration signal;
   a power amplifier that amplifies the calibration signal based in part on a value of an envelope signal to generate an amplified calibration signal;
   an antenna that transmits the amplified calibration signal;
   a coupler that couples a transmit signal that comprises the amplified calibration signal to a receive signal path; and
   a processor that generates a distortion characteristic by comparing a received signal sample with the calibration signal and store the distortion characteristic in a look-up table of the predistortion module to calibrate the predistortion module.

7. The apparatus of claim 6, wherein the envelope signal controls a bias section of the power amplifier.

8. The apparatus of claim 6, further comprising:
   a first plurality of mixers that frequency upconvert the calibration signal;
   a second plurality of mixers that frequency downconvert the received signal sample; and
   a local oscillator that is coupled to the first plurality of mixers and to the second plurality of mixers.

9. The apparatus of claim 6, wherein the coupler is a directional coupler.

10. The apparatus of claim 6, further comprising a switch that couples an output of the power amplifier to an input to the antenna, wherein the coupler is positioned at an output of the switch.

11. The apparatus of claim 6, further comprising a switch that couples an output of the power amplifier to an input to the antenna, wherein the coupler is positioned at an input of the switch.

12. A method for calibrating a predistortion module, comprising:
   generating a calibration signal;
   amplifying the calibration signal based in part on a value of an envelope signal to generate an amplified calibration signal;
   transmitting the amplified calibration signal;
   coupling a transmit signal that comprises the amplified calibration signal to a receive signal path;
   generating a distortion characteristic by comparing the received signal sample with the calibration signal; and storing the distortion characteristic in a look up table of the predistortion module to calibrate the predistortion module.

13. The method of claim 12, wherein the envelope signal controls a bias section of the means for amplifying the calibration signal.

14. The method of claim 12, further comprising compensating for receive phase imbalance.

15. The method of claim 12, wherein the calibration signal is amplified by a power amplifier, and further comprising compensating for leakage from an input of the power amplifier to the receive signal path.

* * * * *